(12) United States Patent
Paneccasio, Jr. et al.

(10) Patent No.: US 9,613,858 B2
(45) Date of Patent: *Apr. 4, 2017

(54) METHOD AND COMPOSITION FOR ELECTRODEPOSITION OF COPPER IN MICROELECTRONICS WITH DIPYRIDYL-BASED LEVELERS

(71) Applicant: Enthone Inc., West Haven, CT (US)

(72) Inventors: Vincent Paneccasio, Jr., Madison, CT (US); Xuan Lin, Watervliet, NY (US); Richard Hurtubise, Clinton, CT (US); Qingyun Chen, Branford, CT (US)

(*) Notice: Subject to any disclaimer, the term of this patent is extended or adjusted under 35 U.S.C. 154(b) by 129 days.

This patent is subject to a terminal disclaimer.

(21) Appl. No.: 14/325,601

(22) Filed: Jul. 8, 2014

(65) Prior Publication Data

US 2014/0322912 A1 Oct. 30, 2014

Related U.S. Application Data

(63) Continuation of application No. 13/785,946, filed on Mar. 5, 2013, now Pat. No. 8,771,495, which is a continuation of application No. 12/324,335, filed on Nov. 26, 2008, now Pat. No. 8,388,824.

(51) Int. Cl.
| | |
|---|---|
| C25D 5/02 | (2006.01) |
| C25D 3/38 | (2006.01) |
| H05K 3/42 | (2006.01) |
| H01L 21/768 | (2006.01) |
| C25D 7/12 | (2006.01) |
| H01L 21/288 | (2006.01) |
| H01L 23/532 | (2006.01) |

(52) U.S. Cl.
CPC .......... *H01L 21/76879* (2013.01); *C25D 3/38* (2013.01); *C25D 5/02* (2013.01); *C25D 7/12* (2013.01); *H01L 21/2885* (2013.01); *H01L 21/76877* (2013.01); *H01L 23/53228* (2013.01); *C25D 7/123* (2013.01); *H01L 2924/0002* (2013.01)

(58) Field of Classification Search
CPC .............. C25D 3/38; C25D 5/02; H05K 3/42
USPC ................ 205/122–123, 125–126, 182, 291, 205/296–298; 438/674–675, 687
See application file for complete search history.

(56) References Cited

U.S. PATENT DOCUMENTS

| | | | | |
|---|---|---|---|---|
| 2,644,789 A | * | 7/1953 | Shenk, Jr. ................ | C25D 3/18 205/277 |
| 2,658,867 A | * | 11/1953 | Little ...................... | C25D 3/18 205/279 |
| 2,839,460 A | * | 6/1958 | Foulke .................... | C25D 3/18 205/277 |
| 3,002,904 A | * | 10/1961 | Foulke .................... | C25D 3/16 205/275 |
| 3,152,975 A | * | 10/1964 | Kardos .................... | C25D 3/12 205/274 |
| 3,591,350 A | * | 7/1971 | Stareck ................... | C25D 5/14 106/1.26 |
| 3,641,034 A | * | 2/1972 | Simon .................... | C08G 73/0627 359/321 |
| 3,652,149 A | * | 3/1972 | Rogers ................... | C09K 9/02 359/266 |
| 3,682,939 A | | 8/1972 | Webster | |
| 3,694,384 A | * | 9/1972 | Factor ................. | C08G 73/0627 521/25 |
| 3,715,289 A | | 2/1973 | Cope, Jr. | |
| 3,821,095 A | * | 6/1974 | Harbulak ................ | C25D 3/22 205/310 |
| 3,856,714 A | * | 12/1974 | Moore .................... | C08G 69/26 524/45 |
| 3,940,320 A | * | 2/1976 | Kardos .................... | C25D 3/38 205/298 |
| 3,956,078 A | | 5/1976 | Kardos et al. | |
| 3,956,084 A | | 5/1976 | Kardos et al. | |
| 4,009,087 A | * | 2/1977 | Kardos .................... | C25D 3/38 205/298 |
| 4,036,710 A | * | 7/1977 | Kardos .................... | C25D 3/38 205/296 |
| 4,038,161 A | * | 7/1977 | Eckles .................... | C25D 3/38 205/297 |
| 4,096,133 A | | 6/1978 | Zweigle | |
| 4,248,632 A | * | 2/1981 | Ehrich ................... | C07F 17/00 106/1.11 |
| 4,292,037 A | * | 9/1981 | Galafassi ................ | C09B 47/32 8/554 |
| 4,617,253 A | * | 10/1986 | Taylor ................... | G03F 7/038 427/553 |
| 4,786,746 A | | 11/1988 | Miljkovic | |
| 4,841,021 A | * | 6/1989 | Katritzky ........... | C08G 73/0627 528/335 |
| 4,983,508 A | * | 1/1991 | Ishiguro ............... | G03C 1/0053 430/567 |
| 5,039,338 A | * | 8/1991 | Kondo .................. | C23C 18/405 106/1.18 |
| 5,051,154 A | | 9/1991 | Bernards et al. | |
| 5,147,905 A | * | 9/1992 | Dubois .................. | C08G 59/02 523/404 |
| 5,252,196 A | | 10/1993 | Sonnenberg et al. | |
| 5,306,336 A | * | 4/1994 | Martyak ............... | C23C 18/405 106/1.23 |

(Continued)

FOREIGN PATENT DOCUMENTS

| | | |
|---|---|---|
| EP | 1148156 A2 | 10/2001 |
| EP | 1422320 A1 | 5/2004 |
| GB | 1202525 A | 8/1970 |
| WO | 02/086196 | * 10/2002 |
| WO | 2004016829 A2 | 2/2004 |

OTHER PUBLICATIONS

Zhou, J. et al, ECS Transactions 2007, 2, 77-92.*
Katritzky, A. et al, Journal of Polymer Science: Part A: Polymer Chemistry 1988, 26, 3323-3336.*

*Primary Examiner* — Arlen Soderquist
(74) *Attorney, Agent, or Firm* — Carmody Torrance Sandak & Hennessey LLP

(57) ABSTRACT

A method and composition for metallizing a via feature in a semiconductor integrated circuit device substrate, using a leveler compound which is a dipyridyl compound.

16 Claims, 5 Drawing Sheets

(56) References Cited

U.S. PATENT DOCUMENTS

| | | | |
|---|---|---|---|
| 5,362,444 A * | 11/1994 | Amtower | A61L 12/086 422/28 |
| 5,382,496 A * | 1/1995 | Sakai | G03C 1/061 430/264 |
| 5,616,317 A * | 4/1997 | Nagase | A01N 43/40 422/16 |
| 5,646,205 A * | 7/1997 | Lee | B01D 67/0088 210/638 |
| 5,763,563 A * | 6/1998 | Harris | H01B 1/121 528/335 |
| 5,824,756 A | 10/1998 | Scriven et al. | |
| 5,965,211 A * | 10/1999 | Kondo | C23C 18/405 427/305 |
| 6,291,778 B1 * | 9/2001 | Asai | H05K 1/112 174/263 |
| 6,437,901 B1 * | 8/2002 | Kobayashi | C09K 9/02 252/586 |
| 6,444,110 B2 | 9/2002 | Barstad et al. | |
| 6,706,418 B2 | 3/2004 | Egli et al. | |
| 6,776,893 B1 * | 8/2004 | Too | C25D 3/38 106/1.26 |
| 6,955,806 B2 * | 10/2005 | Fitzpatrick | A61K 31/74 424/402 |
| 7,128,822 B2 | 10/2006 | Wang et al. | |
| 7,316,772 B2 | 1/2008 | Commander et al. | |
| 7,374,652 B2 | 5/2008 | Hayashi et al. | |
| 7,510,639 B2 | 3/2009 | Wang et al. | |
| 7,651,934 B2 | 1/2010 | Lubomirsky et al. | |
| 7,659,203 B2 | 2/2010 | Stewart et al. | |
| 8,388,824 B2 * | 3/2013 | Paneccasio, Jr. | C25D 3/38 205/118 |
| 8,608,933 B2 * | 12/2013 | Paneccasio, Jr. | C25D 3/38 205/297 |
| 8,771,495 B2 * | 7/2014 | Paneccasio, Jr. | C25D 3/38 205/118 |
| 2003/0021761 A1 * | 1/2003 | Fitzpatrick | A61K 31/74 424/78.1 |
| 2003/0085133 A1 | 5/2003 | Totsuka et al. | |
| 2003/0172969 A1 * | 9/2003 | Jenson | H01L 31/022425 136/252 |
| 2004/0016363 A1 * | 1/2004 | Phelps | C23C 18/52 106/1.17 |
| 2004/0121259 A1 * | 6/2004 | Kozawa | G03F 7/0035 430/270.1 |
| 2004/0187731 A1 | 9/2004 | Wang et al. | |
| 2004/0222104 A1 | 11/2004 | Wang et al. | |
| 2004/0231995 A1 * | 11/2004 | Murao | C25D 3/38 205/125 |
| 2005/0045486 A1 | 3/2005 | Sahoda et al. | |
| 2005/0045488 A1 * | 3/2005 | Paneccasio, Jr. | C25D 3/38 205/291 |
| 2005/0072683 A1 | 4/2005 | Nakada et al. | |
| 2005/0092611 A1 | 5/2005 | Kim et al. | |
| 2006/0047030 A1 * | 3/2006 | Yoshida | C08K 5/34 524/99 |
| 2006/0065537 A1 * | 3/2006 | Barstad | C25D 3/38 205/291 |
| 2006/0073419 A1 * | 4/2006 | Kozawa | G03F 7/40 430/311 |
| 2006/0183328 A1 | 8/2006 | Barstad et al. | |
| 2006/0243599 A1 * | 11/2006 | Shih | C25D 3/38 205/261 |
| 2006/0246699 A1 | 11/2006 | Weidman et al. | |
| 2006/0252252 A1 | 11/2006 | Zhu et al. | |
| 2007/0012576 A1 | 1/2007 | Binstead et al. | |
| 2007/0071888 A1 * | 3/2007 | Shanmugasundram | C23C 18/1608 427/97.7 |
| 2007/0072096 A1 * | 3/2007 | Takakuwa | G03F 7/0007 430/7 |
| 2007/0084732 A1 * | 4/2007 | Wang | C25D 3/02 205/296 |
| 2007/0099422 A1 * | 5/2007 | Wijekoon | C23C 18/165 438/687 |
| 2007/0182791 A1 * | 8/2007 | Chung | B01D 67/0013 347/84 |
| 2008/0266642 A1 * | 10/2008 | Burrell | B60R 1/088 359/270 |
| 2008/0268138 A1 * | 10/2008 | Reddington | C08G 65/3322 427/96.1 |
| 2009/0035940 A1 * | 2/2009 | Richardson | C25D 3/38 438/674 |
| 2009/0103162 A1 * | 4/2009 | Burrell | B60R 1/088 359/272 |
| 2010/0022078 A1 * | 1/2010 | Rockenberger | C09D 5/24 438/585 |
| 2010/0097743 A1 * | 4/2010 | Yoshida | C08K 5/34 361/504 |
| 2014/0102909 A1 * | 4/2014 | Paneccasio, Jr. | C25D 3/38 205/297 |

* cited by examiner

METHOD AND COMPOSITION FOR ELECTRODEPOSITION OF COPPER IN MICROELECTRONICS WITH DIPYRIDYL-BASED LEVELERS

REFERENCE TO RELATED APPLICATION

This application is a continuation of U.S. patent application Ser. No. 13/785,946 filed Mar. 5, 2013, now U.S. Pat. No. 8,771,485, which is a continuation of U.S. patent application Ser. No. 12/324,335 filed Nov. 26, 2008 and issued Mar. 5, 2013 as U.S. Pat. No. 8,388,824, the entire disclosures of which are hereby incorporated by reference.

FIELD OF THE INVENTION

The present invention generally relates to additives for use in an electrolytic deposition chemistry and a method for depositing copper and copper alloys; and more specifically to leveler additives for use in an electrolytic deposition chemistry and a method for copper metallization of interconnect features in semiconductor substrates.

BACKGROUND OF THE INVENTION

The demand for semiconductor integrated circuit (IC) devices such as computer chips with high circuit speed and high circuit density requires the downward scaling of feature sizes in ultra-large scale integration (ULSI) and very-large scale integration (VLSI) structures. The trend to smaller device sizes and increased circuit density requires decreasing the dimensions of interconnect features and increasing their density. An interconnect feature is a feature such as a via or trench formed in a dielectric substrate which is then filled with metal, typically copper, to render the interconnect electrically conductive. Copper has been introduced to replace aluminum to form the connection lines and interconnects in semiconductor substrates. Copper, having better conductivity than any metal except silver, is the metal of choice since copper metallization allows for smaller features and uses less energy to pass electricity. In damascene processing, interconnect features of semiconductor IC devices are metallized using electrolytic copper deposition.

In the context of semiconductor integrated circuit device manufacture, substrates include patterned dielectric films on semiconductor wafer or chip substrates such as, for example, $SiO_2$ or low-κ dielectric films on silicon or silicon-germanium. Typically, a wafer has layers of integrated circuitry, e.g., processors, programmable devices, memory devices, and the like, built into one or more layers of dielectric on a semiconductor substrate. Integrated circuit (IC) devices have been manufactured to contain sub-micron vias and trenches that form electrical connections between layers of interconnect structure (via) and between devices (trench). These features typically have dimensions on the order of about 200 nanometers or less, such as about 150 nanometers, less than about 100 nanometers, or even less than about 50 nanometers.

The use of copper has introduced a number of requirements into the IC manufacturing process. First, copper atoms have a tendency to diffuse into the semiconductor's junctions, such as by current-induced migration, thereby disturbing their electrical characteristics. To combat this occurrence, a barrier layer, such as titanium nitride, tantalum, tantalum nitride, or other layers as are known in the art, is applied to the patterned dielectric prior to the copper metallization that involves copper seed layer deposition (typically be PVD process) followed by electrolytic copper deposition to achieve void-free filling. As the architecture of ICs continues to shrink, this requirement proves to be increasingly difficult to satisfy.

One conventional semiconductor manufacturing process is the copper damascene system. Specifically, this system begins by etching the circuit architecture into the substrate's dielectric material. The architecture is comprised of a combination of the aforementioned trenches and vias. Next, a barrier layer is laid over the dielectric to prevent diffusion of the subsequently applied copper layer into the substrate's junctions, followed by physical or chemical vapor deposition of a copper seed layer to provide electrical conductivity for a sequential electrochemical process. Copper to fill into the vias and trenches on substrates can be deposited by plating (such as electroless or electrolytic), sputtering, plasma vapor deposition (PVD), and chemical vapor deposition (CVD). It is generally recognized that electrochemical deposition is the best method to apply Cu since it is more economical than other deposition methods and can flawlessly fill into the interconnect features (often called "bottom up" growth or superfilling). After the copper layer has been deposited, excess copper is removed from the facial plane of the dielectric by chemical mechanical polishing, leaving copper in only the etched interconnect features of the dielectric. Subsequent layers are produced similarly before assembly into the final semiconductor package.

Copper plating methods must meet the stringent requirements of the semiconductor industry. For example, copper deposits must be uniform and capable of flawlessly filling the small interconnect features of the device, for example, with openings of 100 nm or smaller.

Electrolytic copper systems have been developed which rely on so-called "superfilling" or "bottom-up growth" to deposit Cu into various aspect ratio features. Superfilling involves filling a feature from the bottom up, rather than at an equal rate on all its surfaces, to avoid seams and pinching off that can result in voiding. Multi-part systems consisting of a suppressor and an accelerator as additives have been developed for superfilling, as in Too et al., U.S. Pat. No. 6,776,893, which discloses sulfide-based compounds for accelerating and a polyether-based compound for suppressing. As the result of momentum of bottom-up growth, the Cu deposit is thicker on the areas of interconnect features than on the field area that does not have features. These overgrowth regions are commonly called overplating, overburden, mounding, bumps, or humps. Smaller features generate higher overplating humps due to faster superfill speed. Larger features generally fill slower that can lead to formation of dimples (also called underplate or underplating), and thus will require additional copper plating to achieve complete planarity. Additional copper plating to correct underplating may further exacerbate overplating. Overplating poses challenges for later chemical and mechanical polishing processes that planarize the Cu surface. A third organic additive called a "leveler" is typically used to address overgrowth and other issues, as in Commander et al., U.S. Pub. No. 2003/0168343.

As chip architecture gets smaller, with interconnects having openings on the order of 100 nm and smaller through which Cu must grow to fill the interconnects, there is a need for enhanced bottom-up speed. That is, the Cu must fill "faster" in the sense that the rate of vertical growth from the feature bottom must be substantially greater than the rate of growth on the rest of areas, and even more so than in conventional superfilling of larger interconnects.

In addition to superfilling and overplating issues, microdefects may form when electrodepositing Cu for filling interconnect features. One defect that can occur is the formation of internal voids inside the features. As Cu is deposited on the feature side walls and top entry of the feature, deposition on the side walls and entrance to the feature can pinch off and thereby close access to the depths of the feature especially with features which are small (e.g., <100 nm) and/or which have a high aspect ratio (depth:width) if the bottom-up growth rate is not fast enough. Smaller feature size or higher aspect ratio generally requires faster bottom-up speed to avoid pinching off. Moreover, smaller size or higher aspect ratio features tend to have thinner seed coverage on the sidewall and bottom of a via/trench where voids can also be produced due to insufficient copper growth in these areas. An internal void can interfere with electrical connectivity through the feature.

Microvoids are another type of defect which can form during or after electrolytic Cu deposition due to abnormal Cu growth or grain recrystallization that happens after Cu plating, such as, for example, during high temperature anneal steps. U.S. Pub. No. 2003/0168343 discloses a method of using an electrolytic deposition chemistry comprising a leveler additive that increases the overall impurity (Cl, S, C, O, N) content of copper metallization in interconnect features. While the copper deposit having high impurity may have some advantages such as improving the stress migration resistance of devices, it may not always be advantageous to fill interconnect features in certain devices with copper deposits with high level of impurities. Rather, some devices, particularly memory devices, may require interconnect metallization with a more pure copper deposit. Such a pure copper layer is believed to be less susceptible to microvoiding, have better conductivity and improved resistance to electromigration.

SUMMARY OF THE INVENTION

Among the many aspects of the present invention may be noted a chemistry and a method for depositing copper or copper alloys, and in particular for superfilling interconnect features with high purity copper metallization. The method and composition of the present invention are useful for depositing high purity copper metallization in interconnect features, in which voiding caused by recrystallization is inhibited.

Briefly, therefore, the present invention is directed to a method for metallizing a via feature in a semiconductor integrated circuit device substrate, wherein the semiconductor integrated circuit device substrate comprises a front surface, a back surface, and the via feature and wherein the via feature comprises an opening in the front surface of the substrate, a sidewall extending from the front surface of the substrate inward, and a bottom. The method comprises contacting the semiconductor integrated circuit device substrate with an electrolytic copper deposition chemistry comprising (a) a source of copper ions and (b) a leveler compound, wherein the leveler compound is a reaction product of a dipyridyl compound and an alkylating agent; and supplying electrical current to the electrolytic deposition chemistry to deposit copper metal onto the bottom and sidewall of the via feature, thereby yielding a copper filled via feature.

The invention is also directed to a composition for metallizing a substrate in a variety of applications such as metallizing a via feature in a semiconductor integrated circuit device substrate, the composition comprising a source of copper ions; a leveler compound, wherein the leveler compound is a reaction product of a dipyridyl compound and an alkylating agent; an accelerator; and a suppressor.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE EMBODIMENT(S) OF THE INVENTION

Figure 1:
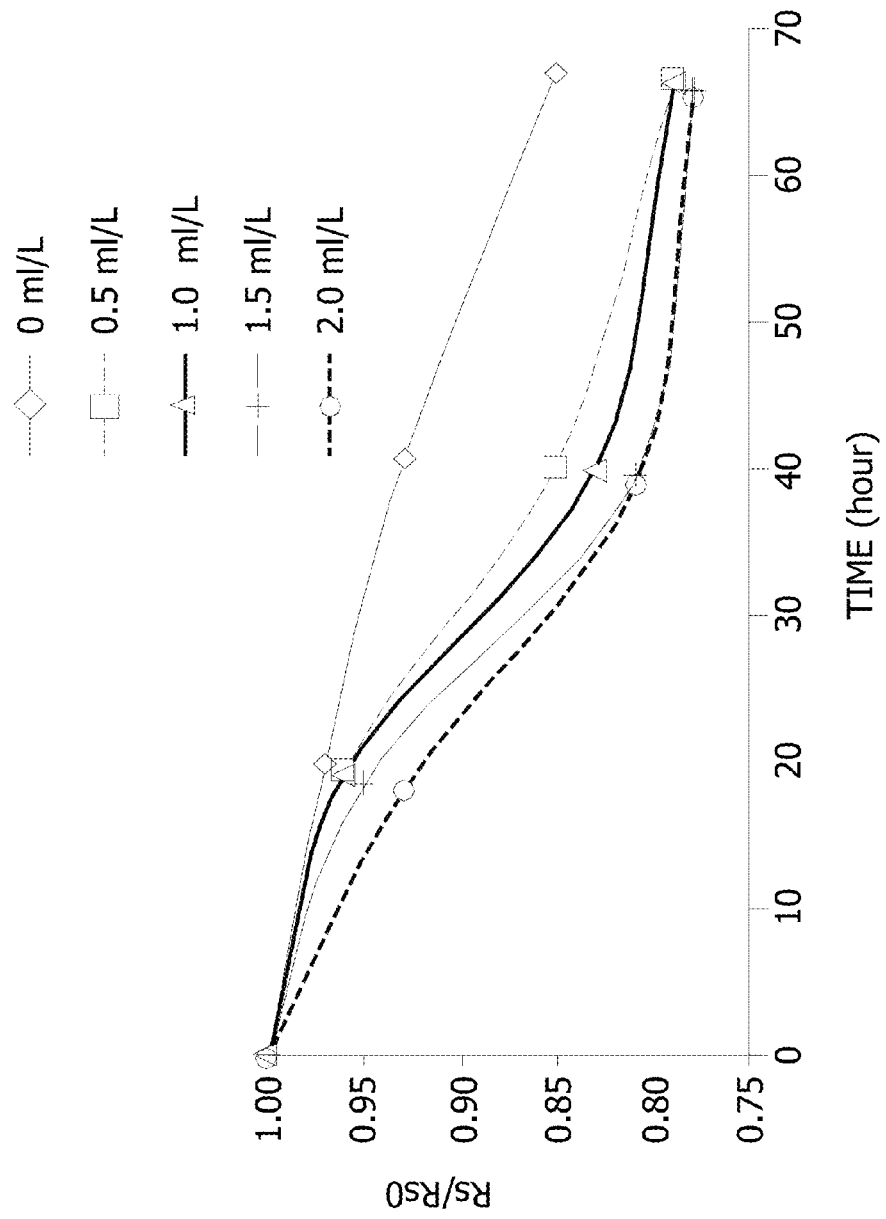
FIG. 1 is a graph of changes in resistance during a room temperature anneal. The data used to construct the graph were collected based on the method of Example 6.

The present invention is directed to a composition and a method for depositing copper or copper alloys. In some embodiments, the present invention is directed to a composition and a method for metallizing an interconnect feature in a semiconductor integrated circuit device substrate with low void volume, high purity copper deposit. The semiconductor integrated circuit device substrate, i.e., a wafer or die, has a front surface and a back surface. The front surface is the surface in which integrated circuitry is built. Accordingly, the interconnect feature, i.e., trench or via, is located in the front surface of the semiconductor substrate. The feature has an opening in the front surface of the substrate, a sidewall extending from the front surface of the substrate, and a bottom. In a conventional damascene process, additional layers of dielectric are typically deposited on top of a filled feature, and the additional dielectric layers are patterned to comprise interconnect features including trenches and via that may be metallized according to the method of the present invention. In other embodiments, the present invention is directed to a composition and a different, non-damascene method for metallizing a substrate such as a through silicon via or other substrate.

Interconnect features are metal traces that provide conductivity between devices built in a dielectric substrate (trench) or between layers of circuitry (via). Devices include transistors, capacitors, etc. in memory cells and logic gates. Typical interconnect opening dimensions, i.e., diameter of a via opening or width of a trench are typically less than about 350 nanometers in some applications, but more typically range from about 200 nm to about 2 nm for damascene interconnect applications. The opening dimensions are generally less than about 200 nm, less than about 100 nm, less than about 50 nm, or even less than about 25 nm. Generally, the opening dimensions are greater than about 2 nm, greater than about 5 nm, greater than about 10 nm, such as at least about 15 nm. The electrolytic copper plating composition of the present invention is capable of superfilling various aspect interconnect feature having aspect ratios in terms of depth:opening of at least about 1:1, such as at least about 2:1, typically at least about 5:1, about 10:1, or even at least about 20:1.

Semiconductor substrates may comprise relatively large sized (0.5 to 30 microns), low aspect ratio features as well. In this regard, the electrolytic deposition chemistry of the invention is also capable of metallizing low aspect ratio features with significantly reduced underplating. Low aspect ratio interconnect features that may be metallized using the electrolytic copper deposition chemistry of the present invention may have aspect ratios in terms of depth:opening of less than about 1:1, such as less than about 0.5:1, less than about 0.2:1, or even less than about 0.05:1.

These features may be located in a patterned dielectric film, the dielectric film located on a semiconductor substrate. The semiconductor substrate may be, for example, a semiconductor wafer or chip. The semiconductor wafer is typically a silicon wafer or silicon chip, although other semiconductor materials, such as germanium, silicon germanium, silicon carbide, silicon germanium carbide, and gallium arsenide are applicable to the method of the present invention.

The semiconductor substrate has deposited thereon a dielectric (insulative) film, such as, for example, $SiO_2$, silicon nitride, silicon oxynitride, carbon-doped silicon oxides, low-κ, or ultra low-κ dielectrics. The dielectric film is typically deposited on the surface of the semiconductor wafer or chip and then patterned by lithography, to achieve the circuitry pattern comprising the aforementioned vias and trenches. Low-κ dielectric refers to a material having a smaller dielectric constant than silicon dioxide (dielectric constant=3.9), such as about 3.5, about 3, about 2.5, about 2.2, or even about 2.0. Low-κ dielectric materials are desirable since such materials exhibit reduced parasitic capacitance compared to the same thickness of $SiO_2$ dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity.

In many logic and memory devices, high purity copper interconnect metallization is desired to decrease resistivity, particularly as device sizes continue to decrease and device density continues to decrease. Highly pure copper traces are capable of carrying more current in a smaller cross-section than copper traces with high impurities. A highly pure copper layer also has lesser tendency to form voids as the individual grains coalesce during high temperature processing steps, e.g., post-deposition anneals. In a low purity deposit, there is a greater tendency to form voids as the grains coalesce and condense, grain boundaries are eliminated and empty space, i.e., a void, is formed within the volume of the feature.

Therefore, the present invention is directed to a method of depositing a highly pure copper layer in which coalescence of individual grains in the deposit is limited and void formation is inhibited. Such a highly pure copper film has been found to exhibit improved corrosion resistance, rapid room temperature crystallization, lower resistivity, improved electromigration resistance, and lower microvoid formation in the post-anneal processing. Additionally, the electrolytic copper plating method and composition of the present invention has been discovered to plate features with large openings with significantly improved underplating characteristics and also to plate small opening features with significantly improved overplating characteristics. In view of the advantages obtained by more productive copper superfilling and leveling of interconnect features, the overplate and underplate of deposited copper has been significantly reduced, which alleviates non-uniformity and decrease the CMP challenges which include high overburden removal and underplate causing CMP erosion.

The method of the present invention is accomplished by incorporating one of a particular class of leveler additives into the electrolytic copper deposition chemistry, these leveler additives having been found to enhance deposition of a highly pure copper layer. The leveler compounds for use in the electrolytic deposition chemistry of the present invention comprise quaternized dipyridyls. In general, quaternized dipyridyls are derived from the reaction between a dipyridyl compound and an alkylating reagent. Although such a reaction scheme is a common method of quaternizing dipyridyls, the levelers of the compound are not limited to only those reaction products that are derived from the reaction between a dipyridyl compound and an alkylating reagent, but rather to any leveler compound having the functionality described herein below.

Dipyridyls that may be quaternized to prepare the levelers of the present invention have the general structure (I):

Structure (I)

wherein $R_1$ is a moiety that connects the pyridine rings. In Structure (I), each line from $R_1$ to one of the pyridine rings denotes a bond between an atom in the $R_1$ moiety and one of the five carbon atoms of the pyridine ring. In some embodiments, $R_1$ denotes a single bond wherein one carbon atom from one of the pyridine rings is directly bonded to one carbon atom from the other pyridine ring.

In some embodiments, the $R_1$ connection moiety may be an alkyl chain, and the dipyridyl may have the general structure (Ia):

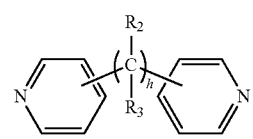

Structure (Ia)

wherein h is an integer from 0 to 6, and $R_2$ and $R_3$ are each independently selected from among hydrogen or a short alkyl chain having from 1 to about 3 carbon atoms. In Structure (Ia), each line from a carbon in the alkyl chain to one of the pyridine rings denotes a bond between a carbon atom in the alkyl chain and one of the five carbon atoms of the pyridine ring. In embodiments wherein h is 0, the connecting moiety is a single bond, and one carbon atom from one of the pyridine rings is directly bonded to one carbon atom from the other pyridine ring.

In some embodiments, the $R_1$ connecting moiety may contain a carbonyl, and the dipyridyl may have the general structure (Ib):

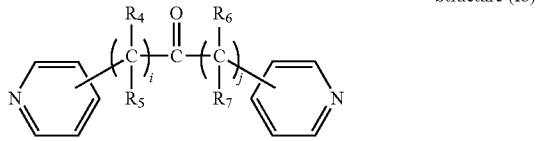

Structure (Ib)

wherein i and j are integers from 0 to 6, and $R_4$, $R_5$, $R_6$, and $R_6$ are each independently selected from among hydrogen or a short alkyl chain having from 1 to about 3 carbon atoms. In Structure (Ib), each line from a carbon in the connecting moiety to one of the pyridine rings denotes a bond between the carbon atom in the connecting moiety and one of the five carbon atoms of the pyridine ring. In embodiments wherein i and j are both 0, the carbon atom of the carbonyl is directly bonded to one carbon atom in each of the pyridine rings.

Two compounds in the general class of dipyridyls of structure (Ib), in which i and j are both 0, are 2,2'-dipyridyl ketone and 4,4'-dipyridyl ketone, having the structures shown below:

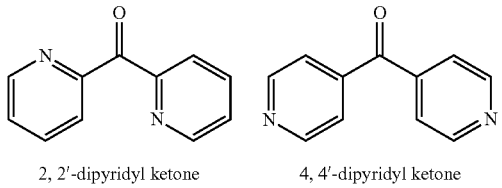

2, 2'-dipyridyl ketone      4, 4'-dipyridyl ketone

In some embodiments, the $R_1$ connecting moiety may contain an amine, and the dipyridyl may have the general structure (Ic):

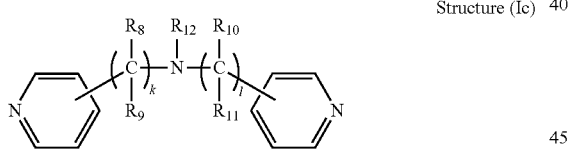

Structure (Ic)

wherein k and l are integers from 0 to 6, and $R_8$, $R_9$, $R_{10}$, $R_{11}$, and $R_{12}$ are each independently selected from among hydrogen or a short alkyl chain having from 1 to about 3 carbon atoms. In Structure (Ic), each line from a carbon in the connecting moiety to one of the pyridine rings denotes a bond between the carbon atom in the connecting moiety and one of the five carbon atoms of the pyridine ring. In embodiments wherein k and l are both 0, the nitrogen is directly bonded to one carbon atom in each of the pyridine rings.

One compound in the general class of dipyridyls of structure (Ic), in which k and l are both 0 and $R_{12}$ is hydrogen, is dipyridin-4-ylamine having the structure shown below:

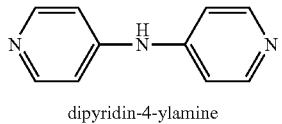

dipyridin-4-ylamine

In some embodiments, the $R_1$ connecting moiety comprises another pyridine. Such a structure is actually a terpyridine having the general structure (Id):

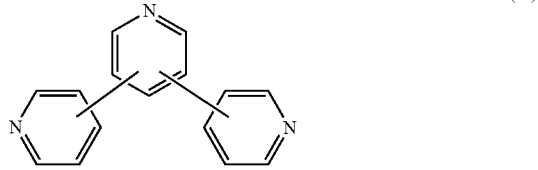

Structure (Id)

In structure (Id), each line from each pyridine ring denotes a bond between one carbon on one ring and another carbon on another ring.

One such compound in the general class compounds of structure (Id) is terpyridine having the structure:

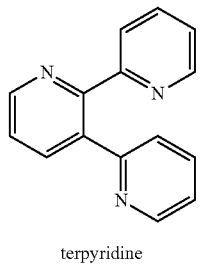 [SMILES: c1ccc(-c2cccnc2-c2ccccn2)nc1]

terpyridine

Preferably, the dipyridyl is chosen from the general class of dipyridyls of general structure (Ia), and further in which $R_2$ and $R_3$ are each hydrogen. These dipyridyls have the general structure (IIa):

Structure (IIa)

wherein m is an integer from 0 to 6. In Structure (IIa), each line from a carbon atom in the alkyl chain to one of the pyridine rings denotes a bond between a carbon atom in the alkyl chain and one of the five carbon atoms of the pyridine ring. In embodiments wherein m is 0, the connecting moiety is a single bond, and one carbon atom from one of the pyridine rings is directly bonded to one carbon atom from the other pyridine ring.

Dipyridyls of the above general structure (IIa) include 2,2'-dipyridyl compounds, 3,3'-dipyridyl compounds, and 4,4'-dipyridyl compounds, as shown in the following structures (IIb) through (IId), respectively:

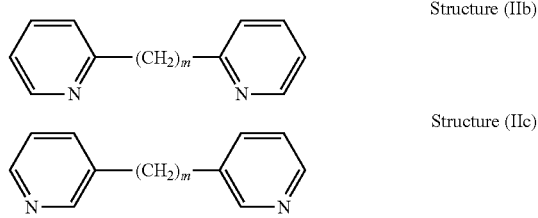

Structure (IIb)

Structure (IIc)

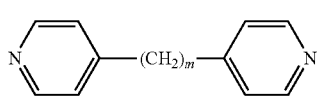

Structure (IId)

wherein m is an integer from 0 to 6. When m is 0, the two pyridine rings are directly bonded to each other through a single bond.

2,2'-dipyridyl compounds include 2,2'-dipyridyl, 2,2'-ethylenedipyridine (1,2-Bis(2-pyridyl)ethane), Bis(2-pyridyl)methane, 1,3-Bis(2-pyridyl)propane, 1,4-Bis(2-pyridyl)butane, 1,5-Bis(2-pyridyl)pentane, and 1,6-Bis(2-pyridyl)hexane.

3,3'-dipyridyl compounds include 3,3'-dipyridyl, 3,3'-ethylenedipyridine (1,2-Bis(3-pyridyl)ethane), Bis(3-pyridyl)methane, 1,3-Bis(3-pyridyl)propane, 1,4-Bis(3-pyridyl)butane, 1,5-Bis(3-pyridyl)pentane, and 1,6-Bis(3-pyridyl)hexane.

4,4'-dipyridyl compounds include, for example, 4,4'-dipyridyl, 4,4'-ethylenedipyridine (1,2-Bis(4-pyridyl)ethane), Bis(4-pyridyl)methane, 1,3-Bis(4-pyridyl)propane, 1,4-Bis(4-pyridyl)butane, 1,5-Bis(4-pyridyl)pentane, and 1,6-Bis(4-pyridyl)hexane.

Of these dipyridyl compounds, 4,4'-dipyridyl compounds are preferred since compounds based on 4,4'-dipyridyl have been found to be particularly advantageous levelers in terms of achieving low impurity inclusion and underplate and overplate reduction. In particular, 4,4'-dipyridyl, having the structure (IIe), and 4,4'-ethylenedipyridine, having structure (IIf), are more preferred, while levelers based on the 4,4'-ethylenedipyridine of structure (IIf) are currently the most preferred levelers.

Structure (IIe)

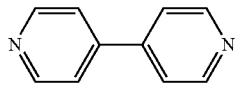

Structure (IIf)

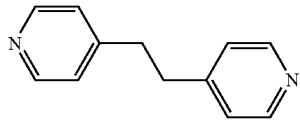

The leveler compounds of the present invention are quaternized dipyridyl compounds, typically prepared by alkylating at least one and preferably both of the nitrogen atoms. Alkylation occurs by reacting the dipyridyl compounds with an alkylating agent. In some embodiments, the alkylating agent may be of a type particularly suitable for forming polymers (see alkylating agents having structures (IIIb) and (IIIc) below). In some embodiments, the alkylating agent is of a type that reacts with the dipyridyl compound but does not form polymers (see alkylating agents having structure (IIIa) below.

Alkylating agents that are suitable for reacting with dipyridyl compounds that generally form non-polymeric levelers may have the general structure (IIIa):

Y—(CH$_2$)$_o$-A      Structure (IIIa)

wherein

A may be selected from among hydrogen, hydroxyl (—OH), alkoxy (—OR$_1$), amine (—NR$_2$R$_3$R$_4$), glycol , aryl

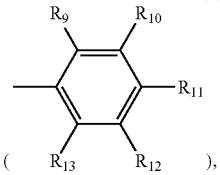

and sulfhydryl or thioether (—SR$_{14}$);

o is an integer between one and six, preferably one or two; and

X is an integer from one to about four, preferably one or two; and

Y is a leaving group. The leaving group may be selected from among, for example, chloride, bromide, iodide, tosyl, triflate, sulfonate, mesylate, dimethyl sulfonate, fluorosulfonate, methyl tosylate, brosylate, or nosylate.

In each A group above, the single line emanating from the functional moiety denotes a bond between an atom in the A moiety, e.g., oxygen, nitrogen, or carbon,) and a carbon of the —(CH$_2$)$_o$— alkylene group. Additionally, the R$_1$ through R$_{14}$ groups denoted in the A moieties of Structure (IIIa) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various alkyl R groups are unsubstituted alkyl.

With regard to the aryl group, any of the R$_6$ through R$_{10}$ carbons, together with an adjacent R group and the carbons to which they are bonded may form an aryl group, i.e., the aryl group comprises a fused ring structure, such as a naphthyl group.

Exemplary A groups include:

hydrogen, hydroxyl (—OH), methoxy (—OCH$_3$), ethoxy (—OCH$_2$CH$_3$), propoxy (—OCH$_2$CH$_2$CH$_3$ or —OCHCH$_3$),
                                                           |
                                                           CH$_3$ amino (—NH$_2$), methylamino (—NHCH$_3$), dimethylamino (—N(CH$_3$)—CH$_3$) [with CH$_3$ above], ethylene glycol (—O—CH$_2$CH$_2$—OH), diethylene glycol (—O—CH$_2$CH$_2$—)$_2$OH), propylene glycol (—OCH$_2$CH$_2$CH$_2$—OH or —OCHCH$_2$—OH),
                                                           CH$_3$ dipropylene glycol (—(OCH$_2$CH$_2$CH$_2$)$_2$OH or —(OCHCH$_2$)$_2$OH),
                                                           CH$_3$ phenyl ( 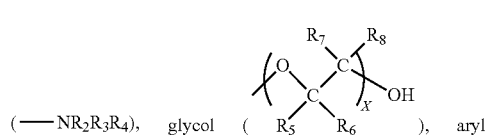 ), naphthenyl (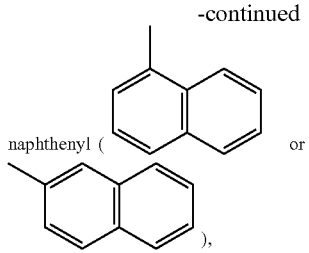 or ![naphthalene structure]), and sulfhydryl (—SH), or derivatives of each of these.

Preferably, A is selected from among:

hydrogen, hydroxyl (—OH), methoxy (—OCH$_3$),
ethoxy (—OCH$_2$CH$_3$),
propoxy (—OCH$_2$CH$_2$CH$_3$ or —OCHCH$_3$),
              |
              CH$_3$
ethylene glycol (—O—CH$_2$CH$_2$—OH),
diethylene glycol (—O—CH$_2$CH$_2$)$_2$—OH),
propylene glycol (—OCH$_2$CH$_2$CH$_2$—OH or
—OCHCH$_2$—OH),
   |
   CH$_3$ phenyl ( ![phenyl] ), and naphthenyl ( ![naphthyl] or ![naphthyl] )

or derivatives of each of these.

More preferably, A is selected from among:

hydroxyl (—OH),
ethylene glycol (—O—CH$_2$CH$_2$—OH),
propylene glycol (—OCH$_2$CH$_2$CH$_2$OH or
—OCHCH$_2$OH
   |
   CH$_3$     ), and phenyl ( ![phenyl] ), or derivatives of each of these.

Preferably, in the alkylating agents of Structure (IIIa), o is one or two, and Y is chloride.

Alkylating agents that react with the dipyridyl compounds and generally form polymeric levelers may have the general structure (IIIb):

Y—(CH$_2$)$_p$—B—(CH$_2$)$_q$—Z    Structure (IIIb)

wherein
B may be selected from among:
a single bond, an oxygen atom (—O—), a methenyl hydroxide $$\begin{array}{c} \text{OH} \\ | \\ -\text{C}- \\ | \\ \text{H} \end{array}$$
(   ), a carbonyl $$\begin{array}{c} \text{O} \\ \| \\ -\text{C}- \end{array}$$
(   ), an amino $$\begin{array}{c} R_1 \\ | \\ -\text{N}- \end{array}$$
(   ), an imino ![imino structure with R2, R3, R4, R5, R6, x]

a sulfur atom (—S—), a sulfoxide $$\begin{array}{c} \text{O} \\ \| \\ -\text{S}- \end{array}$$
(   ), a phenylene ![phenylene with R7, R8, R9, R10]

and a glycol

![glycol structure with R11, R12, R13, R14, x];

and
p and q may be the same or different, are integers between 0 and 6, preferably from 0 to 2, wherein at least one of p and q is at least 1;

X is an integer from one to about four, preferably one or two; and

Y and Z are leaving groups. The leaving group may be selected from among, for example, chloride, bromide, iodide, tosyl, triflate, sulfonate, mesylate, methosulfate, fluorosulfonate, methyl tosylate, brosylate, or nosylate.

In each B group above, the single line emanating from the functional moiety denotes a bond between an atom in the B moiety, e.g., oxygen, nitrogen, or carbon, and a carbon of the $-(CH_2)_p-$ and $-(CH_2)_q-$ alkylene groups. Additionally, the $R_1$ through $R_{14}$ groups in denoted in the B moieties of Structure (IIIb) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various R groups are hydrogen or unsubstituted alkyl, and even more preferably, the R groups are hydrogen.

Preferably, B is selected from among:
an oxygen atom (—O—),
a methenyl hydroxide

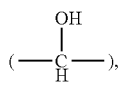

a carbonyl

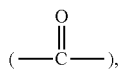

a phenylene group

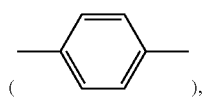

an ethylene glycol group

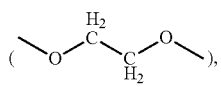

and
a propylene glycol group

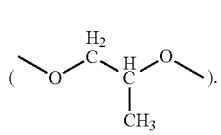

More preferably, B is selected from among:
an oxygen atom (—O—),
a methenyl hydroxide

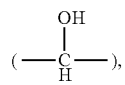

a carbonyl

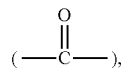

a phenylene group

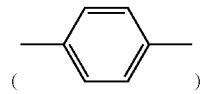

and
an ethylene glycol group

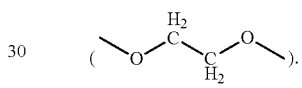

Preferably, in the alkylating agents of Structure (IIIb), p and q are both one or are both two, and Y and Z are both chloride.

Another class of alkylating agents that may form a polymeric leveler when reacted with the dipyridyl compounds includes an oxirane ring and has the general structure (IIIc):

Structure (IIIc)

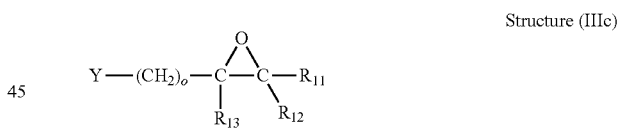

wherein
$R_{11}$, $R_{12}$, and $R_{13}$ are hydrogen or substituted or unsubstituted alkyl having from one to six carbon atoms, preferably from one to three carbon atoms;

o is an integer between one and six, preferably one or two; and

Y is a leaving group. The leaving group may be selected from among, for example, chloride, bromide, iodide, tosyl, triflate, sulfonate, mesylate, methosulfate, fluorosulfonate, methyl tosylate, brosylate, or nosylate.

Preferably, $R_{11}$, $R_{12}$, and $R_{13}$ are hydrogen and the alkylating agent has the following general structure:

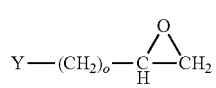

wherein o and Y are as defined in connection with Structure (IIIc).

Preferably, o is one, Y is chloride, and the alkylating agent of general Structure (IIIc) is epichlorohydrin.

The reaction product causes the leaving group to form an anion in the reaction mixture. Since chloride is commonly added to electrolytic copper plating compositions, Y and Z are preferably chloride. While the other leaving groups may be used to form the leveling compounds of the present invention, these are less preferred since they may adversely affect the electrolytic plating composition. Leveling agents that are charge balanced with, for example, bromide or iodide, are preferably ion exchanged with chloride prior to adding the leveling compound to the electrolytic copper plating compositions of the present invention.

Specific alkylating agents of the above structure (IIIa) include, for example, 2-chloroethylether, benzyl chloride, 2-(2-chloroethoxy)ethanol, chloroethanol, 1-(chloromethyl)-4-vinylbenzene, and 1-(chloromethyl)naphthalene. Specific alkylating agents of the above structure (IIIb) include, for example, 1-chloro-2-(2-chloroethoxy)ethane, 1,2-bis(2-chloroethoxy)ethane, 1,3-dichloropropan-2-one, 1,3-dichloropropan-2-ol, 1,2-dichloroethane, 1,3-dichloropropane, 1,4-dichlorobutane, 1,5-dichloropentane, 1,6-dichlorohexane, 1,7-dichloroheptane, 1,8-dichlorooctane, 1,2-di(2-chloroethyl)ether, 1,4-bis(chloromethyl)benzene, m-di(chloromethyl)benzene, and o-di(chloromethyl)benzene. A specific alkylating agent of the above structure (IIIc) is epichlorohydrin. The alkylating agents may comprise bromide, iodide, tosyl, triflate, sulfonate, mesylate, dimethyl sulfonate, fluorosulfonate, methyl tosylate, brosylate, or nosylate derivatives of the above chlorinated alkylating agents, but these are less preferred since chloride ion is typically added to electrolytic copper plating compositions, and the other anions may interfere with copper deposition.

A wide variety of leveler compounds may be prepared from the reaction of the dipyridyl compounds having the general structures (I), (Ia), (Ib), (Ic), (Id), (Id), (IIa), (IIb), (IIc), (IId), (IIe), and (IIf) and the alkylating agents having the general structures (IIIa), (IIIb), and (IIIc). Reactions to prepare the leveler compounds may occur according to the conditions described in Nagase et al., U.S. Pat. No. 5,616,317, the entire disclosure of which is hereby incorporated as if set forth in its entirety. In the reaction, the leaving groups are displaced when the nitrogen atoms on the pyridyl rings react with and bond to the methylene groups in the dihalogen compound. Preferably, the reaction occurs in a compatible organic solvent, preferably having a high boiling point, such as ethylene glycol or propylene glycol.

In some embodiments, the leveler compounds of the present invention are polymers, and the levelers may be prepared by selecting reaction conditions, i.e., temperature, concentration, and the alkylating agent such that the dipyridyl compound and alkylating agent polymerize, wherein the repeat units of the polymer comprise one moiety derived from the dipyridyl compound and one moiety derived from the alkylating. In some embodiments, the dipyridyl compound has the structure (IIa) and the alkylating agent has the general structure depicted above in Structure (IIIb). In some embodiments, therefore, the leveler compound is a polymer comprising the following general structure (IV):

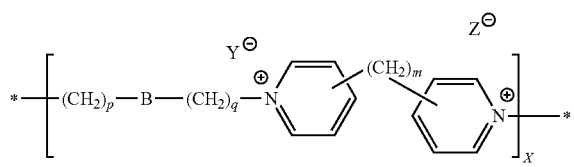

Structure (IV)

wherein B, m, p, q, Y, and Z are as defined with regard to structures (IIa) and (IIIb) and X is an integer that is at least 2. Preferably, X ranges from 2 to about 100, such as from about 2 to about 50, from about 2 to about 25, and even more preferably from about 4 to about 20.

As stated above, preferred dipyridyl compounds have general structure (IId) such that preferred levelers are based on 4,4'-dipyridyl compounds. In some preferred embodiments, the leveler compound is a reaction product of 4,4'-dipyridyl of structure (IIe) and an alkylating agent of structure (IIIb). Reaction conditions, i.e., temperatures, relative concentrations, and choice of alkylating agent may be selected such that 4,4'-dipyridyl and the alkylating agent polymerize, wherein the repeat units of the polymer comprise one moiety derived from 4,4'-dipyridyl and one moiety derived from the alkylating agent. In some embodiments, therefore, the leveler compound is a polymer comprising the following general structure (V):

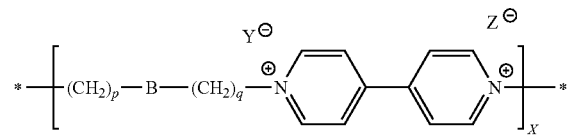

Structure (V)

wherein B, p, q, Y, and Z are as defined with regard to structure (IIIb) and X is an integer of at least 2, preferably from 2 to 100, such as from 2 to 50, and more preferred from 3 to about 20.

One particular leveler compound in the class of levelers of structure (V) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound is a polymer comprising the following structure (VI):

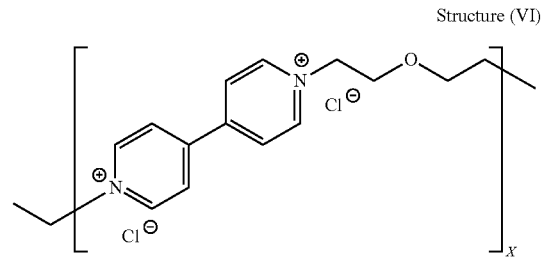

Structure (VI)

wherein X is an integer of at least 2, preferably from 2 to 100, such as from 2 to 50, and more preferred from 3 to about 20.

In some preferred embodiments, the leveler compound is a reaction product of 4,4'-dipyridyl of structure (IIf) and an alkylating agent of structure (IIIb). Reaction conditions, i.e., temperatures, relative concentrations, and choice of alkylating agent may be selected such that 4,4'-ethylenedipyridine and the alkylating agent polymerize, wherein the repeat units of the polymer comprise one moiety derived from 4,4'-ethylenedipyridine and one moiety derived from the alkylating agent. In some embodiments, therefore, the leveler compound is a polymer comprising the following general structure (VII):

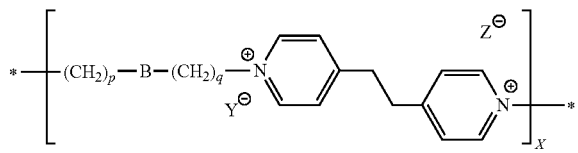

Structure (VII)

wherein B, p, q, Y, and Z are as defined with regard to structure (IIIb) and X is an integer of at least 2, preferably from 2 to 100, such as from 2 to 50, and more preferred from 3 to about 20.

One particular leveler compound in the class of levelers of structure (VII) is polymer that may be prepared from reacting 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound is a polymer comprising the following structure (VIII):

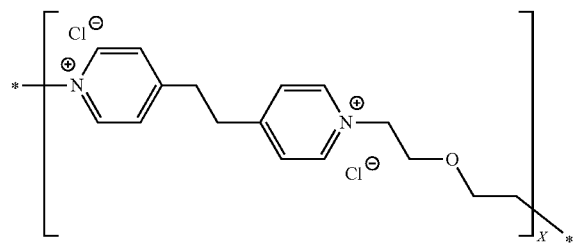

Structure (VIII)

wherein X is an integer of at least 2, preferably from 2 to 100, such as from 2 to 50, and more preferred from 3 to about 20, such as from about 4 to about 8, or from about 12 to about 16. In one preferred leveler of structure (VIII), X is an average value from about 5 to about 6. In one preferred leveler of structure (VIII), X is an average value from about 13 to about 14.

Another leveler compound in the class of levelers of structure (VII) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound is a polymer comprising the following structure (IX):

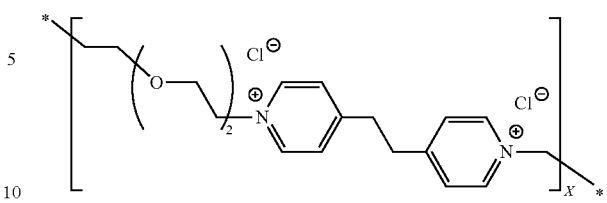

Structure (IX)

wherein X is an integer of at least 2, preferably from 2 to 100, such as from 2 to 50, and more preferred from 3 to about 20.

Another leveler compound in the class of levelers of structure (VII) is a polymer that may be prepared by reacting 4,4'-ethylenedipyridine and an alkylating agent wherein B is the carbonyl, p and q are both 1, and Y and Z are both chloride, i.e., 1,3-dichloropropan-2-one. This leveler compound is a polymer comprising the following structure (X):

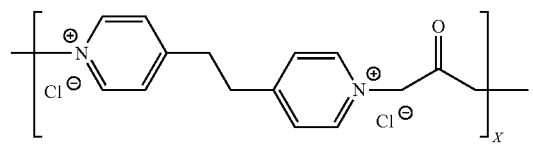

Structure (X)

wherein X is an integer of at least 2, preferably from 2 to 100, such as from 2 to 50, and more preferred from 3 to about 20.

Another leveler compound in the class of levelers of structure (VII) is a polymer that may be prepared by reacting 4,4'-ethylenedipyridine and an alkylating agent wherein B is the methenyl hydroxide, p and q are both 1, and Y and Z are both chloride, i.e., 1,3-dichloropropan-2-ol. This leveler compound is a polymer comprising the following structure (XI):

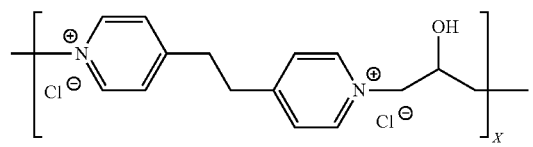

Structure (XI)

wherein X is an integer of at least 2, preferably from 2 to 100, such as from 2 to 50, and more preferred from 3 to about 20.

Another leveler compound in the class of levelers of structure (VII) is a polymer that may be prepared by reacting 4,4'-ethylenedipyridine and an alkylating agent wherein B is the phenylene, p and q are both 1, and Y and Z are both chloride, i.e., 1,4-bis(chloromethyl)benzene. This leveler compound is a polymer comprising the following structure (XII):

Structure (XII)

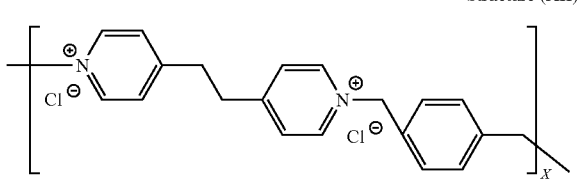

wherein X is an integer of at least 2, preferably from 2 to 100, such as from 2 to 50, and more preferred from 3 to about 20.

In some embodiments, the leveler compounds may be prepared by reacting a dipyridyl compound having the structure (IIa) and an alkylating agent having the general structure depicted above in Structure (IIIb) in a manner that does not form a polymeric leveler. That is, the levelers may be prepared by selecting reaction conditions, i.e., temperature, concentration, in which the alkylating agent such that the dipyridyl compound and alkylating agent react but do not polymerize. The leveler compound may comprise the following structure (XIII):

Structure (XIII)

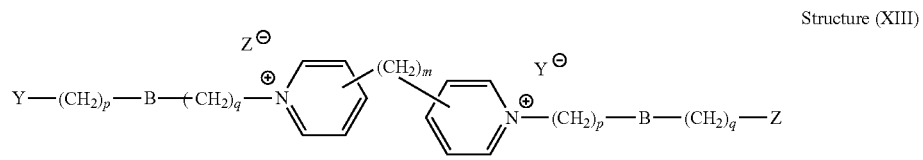

wherein B, m, p, q, Y, and Z are as defined with regard to structures (IIa) and (IIIb).

As stated above, preferred dipyridyl compounds have general structure (IId) such that preferred levelers are based on 4,4'-dipyridyl compounds. In some preferred embodiments, the leveler compound is a reaction product of 4,4'-dipyridyl of structure (IIe) and an alkylating agent of structure (IIIb) and may comprise the following structure (XIV):

Structure (XIV)

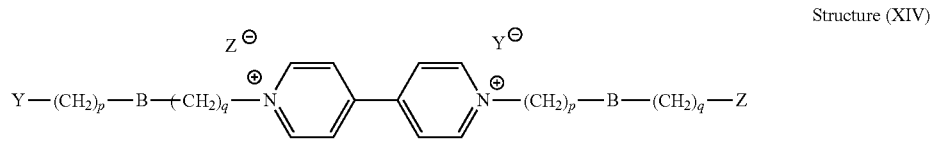

wherein B, p, q, Y, and Z are as defined with regard to Structure (IIIb).

One particular leveler compound in the class of levelers of structure (XIV) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound may comprise the following structure (XV):

Structure (XV)

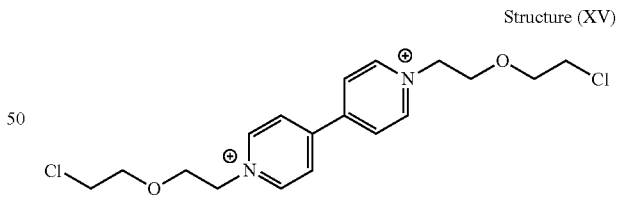

In some preferred embodiments, the leveler compound is a reaction product of 4,4'-dipyridyl of structure (IIf) and an alkylating agent of structure (IIIb). In some embodiments, therefore, the leveler compound may comprise the following structure (XVI):

Structure (XVI)

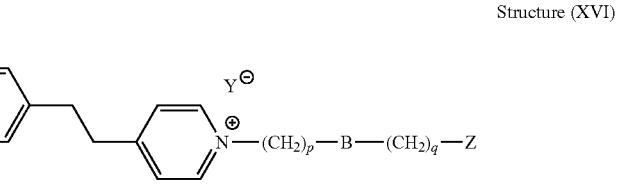

wherein B, p, q, Y, and Z are as defined with regard to structure (IIIb).

One particular leveler compound in the class of levelers of structure (XVI) is the reaction product of the 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound may comprise the following structure (XVII):

Structure (XVII)

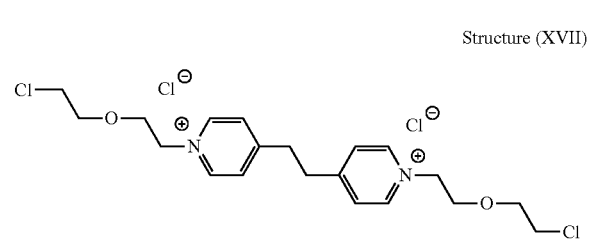 [SMILES: [Cl-] ; ClCCOCC[n+]1ccc(CCc2cc[n+](CCOCCCl)cc2)cc1 ; [Cl-]]

Another leveler compound in the class of levelers of structure (XVI) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound may comprise the following structure (XVIII):

Structure (XVIII)

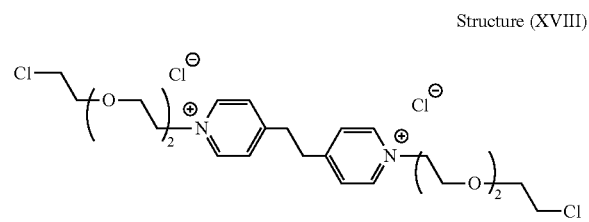

In some embodiments, the leveler compound may be prepared by reacting a dipyridyl molecule having the structure (IIa) and an alkylating agent having the general structure depicted above in structure (IIIa). This leveler compound may comprise the following structure (XIX):

Structure (XIX)

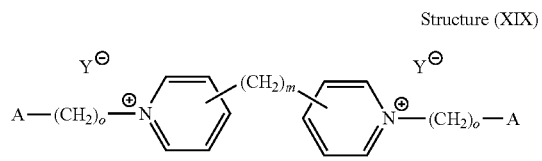

wherein A, m, o, and Y are as defined with regard to structures (IIa) and (IIIa).

In some preferred embodiments, the leveler compound is a reaction product of 4,4'-dipyridyl of structure (IIf) and an alkylating agent of structure (IIIa). In some embodiments, therefore, the leveler compound may comprise the following structure (XX):

Structure (XX)

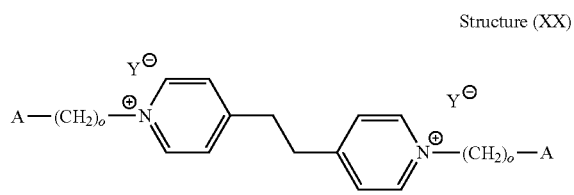

wherein A, o, and Y are as defined with regard to structure (IIIa).

One particular leveler compound in the class of levelers of structure (XX) is the reaction product of the 4,4'-ethylenedipyridine and an alkylating agent wherein A is the phenyl group, o is 1, and Y is chloride, i.e., benzyl chloride. This leveler compound may comprise the following structure (XXI):

Structure (XXI)

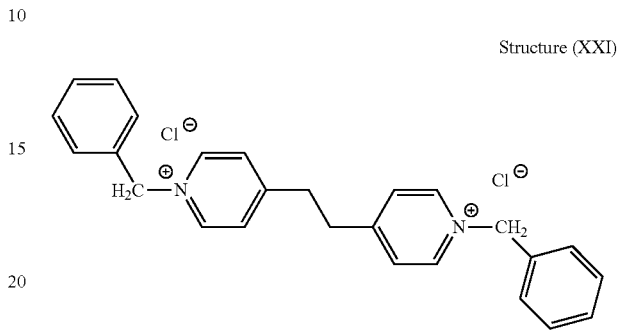

The leveler compound may be added to the electrolytic copper deposition chemistry at a concentration between about 0.1 mg/L to about 400 mg/L, such as from about 1 mg/L to about 40 mg/L, preferably from about 2 mg/L to about 10 mg/L. The levelers are typically prepared in a reaction solvent comprising a high portion of high boiling glycol, such as ethylene glycol or propylene glycol. The solution is then diluted to final volume with high purity water. An aliquot comprising the leveler compound may be used to add the leveler to the electrolytic copper plating composition in the concentrations indicated above. Advantageously, electrolytic copper plating compositions have been discovered to be tolerant to relatively higher concentrations of the leveler compounds of the present invention compared to conventional leveler compounds. That is, an electrolytic copper plating composition may be tolerant to higher concentrations of the leveler compounds of the present invention without negatively impacting gapfill or inhibiting superfilling, such that compositions comprising relatively high concentrations of the levelers of the present invention superfill small features rather than conformal filling which may cause the formation of voids and seams.

The electrolytic deposition chemistry of the present invention additionally comprises a source of copper ions, chloride ions, an acid, an accelerator, and a suppressor. The composition may comprise other materials that deposit properties, such as wetters, grain refiners, secondary brighteners, carriers, levelers and the like. In embodiments wherein an alloy is to be deposited, the electrolytic copper deposition chemistry further comprises a source of metal ions of the alloying metal that may be selected from among a source of tin ions, a source of silver ions, a source of zinc ions, a source of manganese ions, a source of zirconium ions, a source of bismuth ions, or a source of transition or refractory metal ions.

The accelerator and suppressor work together in a manner that advantageously enhance bottom up filling of interconnect features and inhibit conformal and sub-conformal filling. Conformal plating is characterized by a deposit of equal thickness at all points of a feature and may lead to formation of a seam. Conformal plating results from relatively equal copper deposition suppression along the side walls and via bottom, resulting in a relatively equal rate of copper deposition on both the sidewalls and the bottom of the feature.

Copper growth along the sidewalls converges at some point toward the center of the via, forming a seam.

To achieve defect-free filling, i.e., void-free and seam-free, the deposition rate in the bottom should greatly exceed the deposition rate on the side walls. For example, during copper metallization, copper deposition rate along of the bottom (i.e., bottom up or vertical growth rate) is preferably at least one order of magnitude faster than the copper deposition rate along the sidewalls (i.e. lateral or horizontal growth rate).

The accelerator may include an organic sulfur compound. Organic sulfur compounds currently preferred by the applicants are water soluble organic divalent sulfur compounds. In one preferred embodiment, the organic sulfur compound has the following general structure (1):

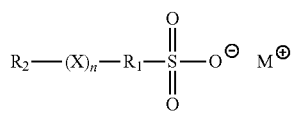

Structure (1)

wherein
X is O or S, preferably S;
n is 1 to 6;
M is hydrogen, alkali metal, or ammonium as needed to satisfy the valence;
$R_1$ is an alkylene or cyclic alkylene group of 1 to 8 carbon atoms, an aromatic hydrocarbon or an aliphatic aromatic hydrocarbon of 6 to 12 carbon atoms; and
$R_2$ is selected from the group of $MO_3SR_1$ wherein M and $R_1$ are as defined above,
a thiocarbamate represented by the formula:

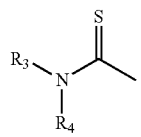

a xanthate represented by the formula:

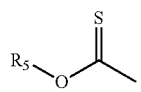

and an aminoimine represented by the formula:

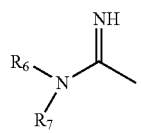

wherein $R_3$, $R_4$, $R_5$, $R_6$, and $R_7$ are independently hydrogen, an alkyl group of 1 to 4 carbon atoms, a heterocyclic group, or an aromatic group. Preferably, X is Sulfur, and n is two.

A preferred organic sulfur compound of Structure (1) have the following general structure (2):

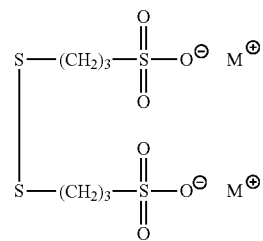

Structure (2)

wherein M is a counter ion possessing charge sufficient to balance the negative charges on the oxygen atoms. M may be, for example, protons, alkali metal ions such as sodium and potassium, or another charge balancing cation such as ammonium or a quaternary amine.

One example of the organic sulfur compound of structure (2) is the sodium salt of 3,3'-dithiobis(1-propanesulfonate), which has the following structure (3):

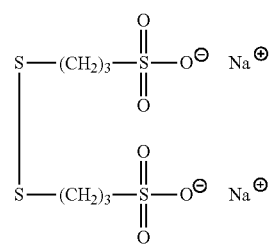

Structure (3)

An especially preferred example of the organic sulfur compound of structure (2) is 3,3'-dithiobis(1-propanesulfonic acid), which has the following structure (4):

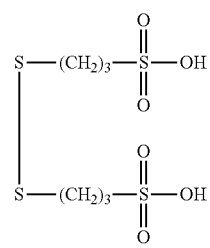

Structure (4)

Another preferred organic sulfur compound of Structure (1) have the following general structure (5):

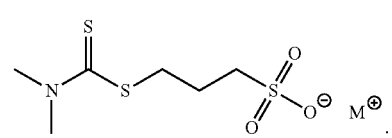

Structure (5)

One example of the organic sulfur compound of structure (5) is 3-(dimethylcarbamothioylthio)propane-1-sulfonic acid:

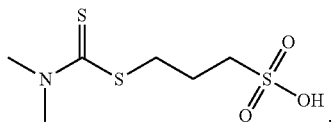

Structure (6)

The organic sulfur compound may be added in a concentration between about 1 mg/L and about 50 mg/L (ppm), typically between about 3 mg/L and about 30 mg/L, such as between about 15 mg/L and 25 mg/L. In a preferred embodiment, the organic sulfur compound is 3,3'-dithiobis(1-propanesulfonic acid) added in a concentration of about 20 mg/L.

Suppressors typically comprise a polyether group covalently bonded to a base moiety. One class of applicable suppressors comprises a polyether group covalently bonded to an amine moiety. Another class of applicable suppressors comprises a polyether group covalently bonded to an alcohol initiating moiety.

With regard to suppressors comprising a polyether group covalently bonded to an amine moiety, the amine may be a primary amine, a secondary amine, a tertiary amine, or a quaternary amine. Primary, secondary, and tertiary amines are weakly basic and become protonated and positively charged when added to a solution comprising an acid. Quaternary amines comprise four nitrogen-substituents, and thus possess positive charge regardless of the solution pH. The primary, secondary, tertiary, and quaternary amines can be substituted or unsubstituted alkyl amines, substituted or unsubstituted cycloalkyl amines, substituted or unsubstituted aromatic amines, substituted or unsubstituted heteroaryl amines, substituted or unsubstituted alkylether amines, and substituted or unsubstituted aromatic alkyl amines.

These suppressors comprise at least one amine functional group, preferably between two amine functional groups and five amine functional groups. Accordingly, the amine may be an amine, a diamine, a triamine, a tetraamine, a pentaamine, or an even higher amine. The alkyl group of the alkylamine can be a substituted or unsubstituted alkyl, preferably a short chain hydrocarbon having between 1 and 8 carbons, which may be branched or straight chained. Exemplary alkylamines can include methylamine, ethylamine, propylamine, n-butylamine, isobutylamine, t-butylamine, ethylenediamine, diethylenetriamine, 1,3-diaminopropane, 1,4-diaminobutane, 2-butene-1,4-diamine, and others. The cycloalkyl group of the cycloalkyl amine typically comprises a 5- or 6-carbon ring, although bicylic, tricylic, and higher multi-cyclic alkyl amines are applicable. Exemplary cycloalkyl amines include substituted or unsubstituted cyclopentylamines, cyclohexylamines, cyclopentylamines, cyclopentyldiamines, cyclohexylamines, cyclopentylamines, cylcoalkyltriamines, and higher cycloalkyl amines. Alkylether amines preferably comprise an ether moiety defined by short chain hydrocarbons typically having between 1 and 8 carbons, such as diethylene glycol diamine and triethylene glycol diamine.

The nitrogen atom can be covalently bonded to one, two, or three PO/EO polyethers. Preferably, the nitrogen atom is covalently bonded to two PO/EO polyethers. The polyether group comprises a chain of repeat units, wherein the chain of repeat units can be formed by the polymerization of epoxide monomers. In a preferred embodiment, the epoxide monomers are selected from ethylene oxide monomer, propylene oxide monomer, and a combination thereof. Preferably, the polyether comprises a chain of repeat units formed by the polymerization of both ethylene oxide monomer and propylene oxide monomer. Accordingly, the ratio of ethylene oxide (EO) repeat units and propylene oxide (PO) repeat units in the polyether can be between about 1:9 and about 9:1. In some embodiments, the ratio is between about 2:3 and about 3:2, such as about 1:1. In some embodiments, the polyether comprises between about 1 and about 30 EO repeat units and between about 30 and about 1 PO repeat units, such as between about 7 and about 15 EO repeat units and between about 15 and about 7 PO repeat units. In a currently preferred embodiment, the polyether comprises, for example, about 11 EO repeat units and about 13 PO repeat units. In another preferred embodiment, the polyether comprises about 7 or 8 EO repeat units and about 9 PO repeat units. Accordingly, the molecular weight of the polyether can be between as low as about 100 g/mol and as high as about 3600 g/mol, preferably between about 1000 g/mol and about 1800 g/mol, and in some embodiments, between about 1200 g/mol and about 1400 g/mol.

The polyether preferably comprises EO repeat units and PO repeat units in random, alternating, or block configurations. In a random configuration, the EO repeat units and PO repeat units have no discernable linear pattern along the polyether chain. In an alternating configuration, the EO repeat units and PO repeat units alternate according to some defined pattern, such as repeating units of EO-PO, PO-EO, and other alternating patterns. The co-polymer can be arranged in a block configuration. In the block configuration, the linear portion of the polyether chain comprises a block of EO repeat units bonded to a block of PO repeat units. The polyether chain may comprise a diblock. That is, the chain may comprise a first block of EO repeat units bonded to a second block of PO repeat units. Alternatively, the chain may comprise a first block of PO repeat units bonded to a second block of EO repeat units. In more complicated block configurations, the polyether chain may comprise a triblock (EO block-PO block-EO block or PO block-EO block-PO block), tetrablock, pentablock, or higher block arrangements. In some embodiments of the block configuration, each block of repeat units comprises between about 1 and about 30 repeat units, more preferably between about 7 and about 15 repeat units. In a preferred embodiment involving a PO block-EO block-PO block tri-block configuration, the first PO-block bonded to the cationic species comprises between about 7 and about 15 PO repeat units, the second EO-block bonded to the PO-block comprises between about 7 and about 15 repeat units, and the third PO-block bonded to the second EO-block comprises between about 1 and about 5 repeat units.

The suppressor compounds of the invention have a molecular weight between about 1000 and about 30,000. An exemplary suppressor compounds comprising a polyether group covalently bonded to amine is shown by structure (A)

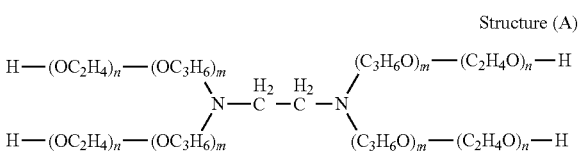

Structure (A)

wherein n can be between 1 and about 30 and m can be between 1 and about 30. Accordingly a suppressor compound having the structure (A) comprises between about 4 and about 120 total PO repeat units and between about 4 and about 120 total EO repeat units on the four PO/EO block copolymers. The molecular weight of the PO (hydrophobic unit) block on a single PO/EO block copolymer can be between about 50 g/mol and about 1800 g/mol, and the molecular weight of the EO (hydrophilic unit) block on a single PO/EO block copolymer can be between about 40 g/mol and about 1400 g/mol. The molecular weight of a single PO/EO copolymer can be between about 100 g/mol about 3600 g/mol. An exemplary suppressor compound having the structure (A) is available from BASF Corporation of Mt. Olive, N.J. under the trade designation Tetronic® 704. This suppressor compound comprises about 13 PO repeat units per PO/EO block copolymer for a total of about 52 PO repeat units on all four PO/EO block copolymers and about 11 EO repeat units per PO/EO block copolymer for a total of about 44 EO repeat units on all four PO/EO block copolymers. Accordingly, the total MW of Tetronic® 704 is between about 5000 g/mol and about 5500 g/mol. Another exemplary block copolymer of structure (A) is also available from BASF Corporation under the trade designation Tetronic® 504. This suppressor compound comprises about 9 PO repeat units per PO/EO block copolymer for a total of about 36 PO repeat units on all four PO/EO block copolymers and about 7.5 EO repeat units per PO/EO block copolymer for a total of about 30 EO repeat units on all four PO/EO block copolymers. Accordingly, the total MW of Tetronic® 504 is between about 3200 g/mol and about 3600 g/mol. The bath composition can comprise a mixture of block copolymers of structure (A).

The suppressor compounds described above can be present in an overall bath concentration between about 10 mg/L to about 1000 mg/L, preferably between about 50 mg/L to about 200 mg/L. Adding the polyether suppressors to copper plating compositions within these concentration ranges is sufficient to fill complex features in an integrated circuit device, with the added benefits of reducing early pinching off, bottom voiding, or sidewall voiding.

With regard to suppressors comprising a polyether group covalently bonded to an initiating moiety comprising an ether group derived from an alcohol initiating moiety, the suppressor comprises at least two distinct ether functional groups: (1) an ether group derived from a reaction between the alcohol and a random glycol unit of the polyether chain, and (2) ether groups derived from reactions between random glycol units within the polyether chain. In another aspect, the polyether chain lacks an initiating moiety, and therefore lacks an ether group derived from a reaction between the alcohol or any other initiating moiety and a random glycol unit of the polyether chain.

In those embodiments where the polyether chain comprises an initiating moiety comprising an ether group derived from an alcohol, suitable alcohols include substituted or unsubstituted acyclic alcohols and substituted or unsubstituted cyclic alcohols. The alcohol comprises at least one hydroxyl group, and thus can be an alcohol or a polyol, the polyol comprising two or more hydroxyl groups, such as between about two hydroxyl groups and about six hydroxyl groups. Acyclic alcohols comprise a substituted or unsubstituted alkyl, preferably a short chain hydrocarbon having between one and about twelve carbons, preferably between about four and about ten carbons, which may be branched or straight chained. Exemplary acyclic alcohols include n-butanol, iso-butanol, tert-butanol, pentanol, neopentanol, tert-amyl alcohol, ethylene glycol, 1,2-butanediol, 1,3-butandiol, 1,4-butanediol, ethylene glycol, and glycerol among others. Cycloalkyl groups typically comprise between about three and about eight, more typically a 5- to 7-carbon ring, although bicylic, tricylic, and higher multi-cyclic alkyl groups are applicable. Exemplary cyclic alcohols include cyclopentanol, 1,2-cyclopentanediol, 1,3-cyclopentanediol, cyclohexanol, 1,2-cyclohexanediol, 1,3-cyclohexanediol, 1,4-cyclohexanediol, and inositol among others.

The polyether comprises a chain of random glycol units, wherein the chain of random glycol units can be formed by the polymerization of epoxide monomers. Preferably, the polyether comprises a chain of random glycol units formed by the polymerization of both ethylene oxide monomer and propylene oxide monomer. The ratio of ethylene oxide (EO) glycol units and propylene oxide (PO) glycol units in the polyether can be between about 1:9 and about 9:1. In some embodiments, the ratio is between about 1:3 and about 3:1, such as about 1:1. The random polyether can comprise up to about 800 EO glycol units and up to about 250 PO glycol units. In some embodiments, the random polyether comprises between about 1 and about 120 EO glycol units and between about 120 and about 1 PO glycol units, such as between about 15 and about 60 EO glycol units and between about 60 and about 15 PO glycol units. In a preferred embodiment, the random polyether comprises between about 20 and about 25 EO glycol units and between about 15 and about 20 PO glycol units. In another preferred embodiment, the random polyether comprises between about 38 and about 42 EO glycol units and between about 28 and about 32 PO glycol units. In yet another preferred embodiment, the random polyether comprises between about 56 and about 60 EO glycol units and between about 42 and about 46 PO glycol units.

The molecular weight of the random polyether can be as low as about 1000 g/mole and as high as about 90,000 g/mole, preferably between about 3000 g/mole and about 30,000 g/mole, and more preferably, between about 3000 g/mole and about 12,000 g/mole.

An exemplary suppressor compound comprising a polyether group covalently bonded to a moiety derived from an alcohol is shown by structure (B). Structure (B) is a suppressor comprising a PO/EO random copolymer covalently bonded to a moiety derived from n-butanol having the structure:

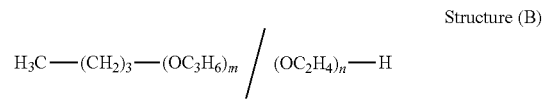

Structure (B)

wherein n can be between 1 and about 200 and m can be between 1 and about 200. Preferably, n is at least about 29 and m is at least about 22. The number ratio of EO:PO units is such that the suppressor compound preferably comprises between about 45% and about 55% by weight EO units and between about 55% and about 45% by weight PO units, the EO and PO units arranged randomly in the polyether chain. In one exemplary suppressor compound, the suppressor comprises about 50% by weight EO units and about 50% by weight PO units arranged randomly in the polyether chain. The molecular weight of the random PO/EO copolymer can be between about 1000 g/mole and about 10,000 g/mole, at least 2800 g/mole, and preferably between about 3000 g/mole and about 4000 g/mole.

An exemplary suppressor compound having the structure (B) is available from The Dow Chemical Company of Midland, Mich. under the trade designation UCON™ 50HB 2000. It is also available from BASF under the trade name of PLURASAFE WS Fluids and from Huntsman under the trade name of WS-4000. The suppressor's UCON designation is indicative of its composition. That is, 50HB indicates that about 50% of the suppressor's molecular weight is due to EO units and about 50% of its molecular weight is due to PO units. Accordingly, UCON™ 50HB 2000 comprises about 22 PO units in the random PO/EO copolymer and about 29 EO units in the random PO/EO copolymer. Another exemplary random copolymer of structure (B), also available from The Dow Chemical Company, is sold under the trade designation UCON™ 50HB 3520. This suppressor compound comprises about 28 PO units in the random PO/EO copolymer and about 38 EO units in the random PO/EO copolymer. Yet another exemplary random copolymer of structure (B), also available from The Dow Chemical Company, is sold under the trade designation UCON™ 50HB 5100. This suppressor compound comprises about 33 PO units in the random PO/EO copolymer and about 44 EO units in the random PO/EO copolymer.

As noted above, in an alternative embodiment the suppressor compound can comprise a polyether chain which lacks an initiating moiety, such as an alcohol or amine. Accordingly, the suppressor compound comprising a PO/EO random copolymer can have the structure (C):

HO—$(C_3H_6O)_m/(C_2H_4O)_n$—H　　　　　　　　Structure (C)

wherein n can be between 1 and about 550 and m can be between 1 and about 125. Preferably, n is at least about 200 and m is at least about 50. The number ratio of EO:PO units is such that the suppressor compound preferably comprises between about 70% and about 75% by weight EO units and between about 30% and about 25% by weight PO units, the EO and PO units arranged randomly in the polyether chain. In one exemplary suppressor compound, the suppressor comprises about 75% by weight EO units and about 25% by weight PO units arranged randomly in the polyether chain. The molecular weight of the random PO/EO copolymer is at least about 2800 g/mole and can be between about 3000 g/mole and about 30,000 g/mole, preferably between about 11,000 g/mole and about 13,000 g/mole. One exemplary suppressor compound has a molecular weight of about 12,000 g/mole. Suppressors having structure (C) can be prepared by adding base initiator, such as KOH, to a solution comprising a precursor and both PO and EO monomer units, which are present in solution in concentrations sufficient to achieve random polyether chains comprising the PO and EO units in the desired ratio. The base initiators are not incorporated into the polyether, such that the polyether comprises only PO and EO units in a random configuration.

An exemplary suppressor compound having structure (C) is available from The Dow Chemical Company of Midland, Mich. under the trade designation UCON™ 75H 90,000. UCON™ 75H 90,000 comprises about 52 PO units in the random PO/EO copolymer and about 204 EO units in the random PO/EO copolymer.

The suppressor compounds described above have sufficient solubility in aqueous solution such that they can be present in an overall bath concentration between about 10 mg/L to about 1000 mg/L, preferably between about 100 mg/L to about 300 mg/L.

A wide variety of electrolytic copper deposition chemistries are potentially applicable. The electrolytic baths include acid baths and alkaline baths. Exemplary electrolytic copper plating baths include copper fluoroborate, copper pyrophosphate, copper cyanide, copper phosphonate, copper sulfate, and other copper metal complexes such as copper methane sulfonate and copper hydroxyethyl sulfonate. Preferred copper sources include copper sulfate in sulfuric acid solution and copper methane sulfonate in methane sulfonic acid solution.

In embodiments wherein the copper source is copper sulfate and the acid is sulfuric acid, the concentration of copper ion and acid may vary over wide limits; for example, from about 4 to about 70 g/L copper and from about 2 to about 225 g/L sulfuric acid. In this regard the compounds of the invention are suitable for use in distinct acid/copper concentration ranges, such as high acid/low copper systems, in low acid/high copper systems, and mid acid/high copper systems. In high acid/low copper systems, the copper ion concentration can be on the order of 4 g/L to on the order of 30 g/L; and the acid concentration may be sulfuric acid in an amount of greater than about 100 g/L up to about 225 g/L. In one high acid/low copper system, the copper ion concentration is about 17 g/L where the $H_2SO_4$ concentration is about 180 g/L. In some low acid/high copper systems, the copper ion concentration can be between about 35 g/L and about 65 g/L, such as between about 38 g/L and about 42 g/L. 35 g/L copper ion corresponds to about 140 g/L $CuSO_4.5H_2O$ copper sulfate pentahydrate. In some low acid/high copper systems, the copper ion concentration can be between about 30 g/L and about 60 g/L, such as between about 35 g/L and about 45 g/L. The acid concentration in these systems is preferably less than about 100 g/L. In some low acid/high copper systems, the acid concentration can be between about 5 g/L and about 30 g/L, such as between about 10 g/L and about 15 g/L. In an exemplary low acid/high copper system, the copper ion concentration is about 40 g/L and the $H_2SO_4$ concentration is about 10 g/L. In another exemplary low acid/high copper system, the copper ion concentration is about 55 g/L and the $H_2SO_4$ concentration is about 25 g/L. In mid acid/high copper systems, the copper ion concentration can be on the order of 30 g/L to on the order of 65 g/L; and the acid concentration may be sulfuric acid in an amount of greater than about 50 g/L up to about 100 g/L. In one mid acid/high copper system, the copper ion concentration is about 50 g/L where the $H_2SO_4$ concentration is about 80 g/L.

In other embodiments, the copper source is copper methanesulfonate and the acid is methanesulfonic acid. The use of copper methanesulfonate as the copper source allows for greater concentrations of copper ions in the electrolytic copper deposition chemistry in comparison to other copper ion sources. Accordingly, the source of copper ion may be added to achieve copper ion concentrations greater than about 80 g/L, greater than about 90 g/L, or even greater than about 100 g/L, such as, for example about 110 g/L. Preferably, the copper methane sulfonate is added to achieve a copper ion concentration between about 30 g/L and about 100 g/L, such as between about 40 g/L and about 60 g/L. High copper concentrations enabled by the use of copper methane sulfonate is thought to be one method for alleviating the mass transfer problem, i.e., local depletion of copper ions particularly at the bottom of deep features, that is a potential source of seams and voids. High copper concentrations in the bulk solution contribute to a steep copper concentration gradient that enhances diffusion of copper into the features.

When copper methane sulfonate is used, it is preferred to use methane sulfonic acid for acid pH adjustment. This avoids the introduction of unnecessary anions into the electrolytic deposition chemistry. When methane sulfonic acid is added, its concentration may be between about 1 mL/L and about 400 mL/L. It has been discovered that the electrolytic deposition chemistry of the present invention preferably has a low acid concentration, such as between about 1 mL/L and about 50 mL/L, such as between about 5 mL/L and about 25 mL/L, such as about 10 mL/L.

Chloride ion may also be used in the bath at a level up to about 200 mg/L (about 200 ppm), preferably about 10 mg/L to about 90 mg/L (10 to 90 ppm), such as about 50 mg/L (about 50 ppm). Chloride ion is added in these concentration ranges to enhance the function of other bath additives. In particular, it has been discovered that the addition of chloride ion enhances void-free filling.

A source of alloying metal ions may be added to the composition to plate copper ions. Sources of alloying metal ions include a source of tin ions, a source of silver ions, a source of zinc ions, a source of manganese ions, a source of zirconium ions, a source of bismuth ions, or a source of transition or refractory metal ions. Typically, the sources of these alloying metal ions may be the same as the source of copper ions. That is, if copper sulfate is used as the copper source, it is preferred to use tin sulfate and zinc sulfate as the alloying metal ion sources. Alternatively, if copper methanesulfonate is used, the sources of tin ions and zinc ions are preferably the methanesulfonate salts of these ions. These are typically added in concentrations from about 0.05 to about 25 g/L. The concentration may vary depending upon the desired alloying metal content in the deposited copper alloy.

A large variety of additives may typically be used in the bath to provide desired surface finishes and metallurgies for the copper plated metal. Usually more than one additive is used to achieve desired functions. At least two additives or three are generally used to initiate bottom-up filling of interconnect features as well as for improved metal metallurgical, physical and electrical properties (such as electrical conductivity and reliability). Additional additives (usually organic additives) include wetter, grain refiners and secondary brighteners and polarizers for the suppression of dendritic growth, improved uniformity and defect reduction.

Plating equipment for plating semiconductor substrates is well known and is described in, for example, Haydu et al. U.S. Pat. No. 6,024,856. Plating equipment comprises an electrolytic plating tank which holds copper electrolytic solution and which is made of a suitable material such as plastic or other material inert to the electrolytic plating solution. The tank may be cylindrical, especially for wafer plating. A cathode is horizontally disposed at the upper part of the tank and may be any type substrate such as a silicon wafer having openings such as trenches and vias. The wafer substrate is typically coated first with a barrier layer, which may be titanium nitride, tantalum, tantalum nitride, or ruthenium to inhibit copper diffusion and next with a seed layer of copper or other metal to initiate copper superfilling plating thereon. A copper seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode such as copper metal.

The bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives on the anode surface.

The cathode substrate and anode are electrically connected by wiring and, respectively, to a rectifier (power supply). The cathode substrate for direct or pulse current has a net negative charge so that copper ions in the solution are reduced at the cathode substrate forming plated copper metal on the cathode surface. An oxidation reaction takes place at the anode. The cathode and anode may be horizontally or vertically disposed in the tank.

During operation of the electrolytic plating system, a pulse current, direct current, reverse periodic current, or other suitable current may be employed. The temperature of the electrolytic solution may be maintained using a heater/cooler whereby electrolytic solution is removed from the holding tank and flows through the heater/cooler and then is recycled to the holding tank.

It is an optional feature of the process that the plating system be controlled as described in U.S. Pat. No. 6,024,856 by removing a portion of the electrolytic solution from the system when a predetermined operating parameter (condition) is met and new electrolytic solution is added to the system either simultaneously or after the removal in substantially the same amount. The new electrolytic solution is preferably a single liquid containing all the materials needed to maintain the electrolytic plating bath and system. The addition/removal system maintains a steady-state constant plating system having enhanced plating effects such as constant plating properties. With this system and method the plating bath reaches a steady state where bath components are substantially a steady-state value.

Electrolysis conditions such as applied voltage, current density, solution temperature and flow condition are essentially the same as those in conventional electrolytic copper plating methods. For example, the bath temperature is typically about room temperature such as about 20-27° C., but may be at elevated temperatures up to about 40° C. or higher. The electrical current density is typically up to about 20 A/dm$^2$, such as about 10 A/dm$^2$, and typically from about 0.2 A/dm$^2$ to about 6 A/dm$^2$. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank.

Copper deposited from the electrolytic deposition chemistry of the present invention comprising the above-described leveler compounds is of high purity and density. In one aspect, the copper has low sulfur content. Copper deposited from an electrolytic deposition chemistry comprising about 1 to 10 mg/L (ppm) of the leveler compound of the present invention may have a sulfur content in the copper deposit of less than about 10 ppm, preferably less than about 5 ppm, more preferably less than about 1 ppm. Sulfur content may be as low as about 0.5 ppm, or even about 0.1 ppm.

In one aspect, the copper has low oxygen content. Copper deposited from an electrolytic deposition chemistry comprising about 1 to 10 mg/L of the leveler compound of the present invention may have an oxygen content of less than about 100 ppm, preferably less than about 50 ppm, more preferably less than about 20 ppm. Oxygen content may be as low as about 10 ppm, or even about 1 ppm.

In one aspect, the copper has low chloride content. Copper deposited from an electrolytic deposition chemistry comprising about 1 to 10 mg/L of the leveler compound of the present invention may have a chloride content of less than about 50 ppm, preferably less than about 10 ppm, more preferably less than about 2 ppm. Chloride content may be as low as about 0.5 ppm, or even about 0.1 ppm.

In one aspect, the copper has low carbon content. Copper deposited from an electrolytic deposition chemistry comprising about 1 to 10 mg/L of the leveler compound of the present invention may have a carbon content of less than about 100 ppm, preferably less than about 50 ppm, more preferably less than about 20 ppm. Carbon content may be as low as about 10 ppm, or even about 2 ppm.

The high purity deposits obtained in the copper deposited from the electrolytic copper plating composition of the present invention facilitate fast anneal, even at room temperature. High purity copper deposit is believed to be beneficial for electromigration resistance and thus increases the reliability of devices. At the 32 nm and the 22 nm node and beyond, the inhibition of electromigration is critical, which is favored by using the electrolytic copper plating chemistry and method of the present invention for depositing highly pure copper layers that resist electromigration.

Copper metallization upon initial deposition is in a state in which it undergoes recrystallization which typically causes individual copper grains to grow in size and which decreases the resistivity of the deposited copper. Wafer manufacturers may subject wafers having copper metallization therein to temperatures of about 200° C. for about 30 minutes to catalyze this process. It has been additionally discovered that the high purity copper deposited from the electrolytic copper plating composition of the present invention undergoes relatively rapid recrystallization at room temperature in which the copper deposit resistance decreases in a manner of hours.

Having described the invention in detail, it will be apparent that modifications and variations are possible without departing from the scope of the invention defined in the appended claims.

EXAMPLES

The following non-limiting examples are provided to further illustrate the present invention.

Example 1

Electrolytic Copper Deposition Chemistry of the Invention

An electrolytic copper plating composition of the invention was prepared having the following components and concentrations:
Copper ion from copper sulfate (40 g/L $Cu^{2+}$)
Sulfuric Acid (10 g/L)
Chloride ion (50 ppm)
ViaForm® Extreme Accelerator (6 mL/L)
ViaForm® Extreme Suppressor (2 mL/L)
Leveler of Structure (VIII) having 13 to 14 repeat units (4 mg/L)
The electrolytic copper deposition chemistry was prepared according to the instructions provided by ViaForm® manufacturer Enthone Inc. (West Haven, Conn.) with the exception of the addition of the Leveler additive of the invention.

Example 2

Electrolytic Copper Deposition Chemistry of the Invention

An electrolytic copper deposition chemistry of the invention was prepared having the following components and concentrations:
Copper ion from copper sulfate (40 g/L $Cu^{2+}$)
Sulfuric Acid (10 g/L)
Chloride ion (50 ppm)
ViaForm® Extreme Accelerator (6 mL/L)
ViaForm® Extreme Suppressor (2 mL/L)
Leveler of Structure (VIII) having 5 to 6 repeat units (6 mg/L)
The electrolytic copper deposition chemistry was prepared according to the instructions provided by ViaForm® manufacturer Enthone Inc. (West Haven, Conn.) with the exception of the addition of the Leveler additive of the invention.

Example 3

Comparative Electrolytic Copper Deposition Chemistry

An electrolytic copper deposition chemistry of the invention was prepared having the following components and concentrations:
Copper ion from copper sulfate (40 g/L $Cu^{2+}$)
Sulfuric Acid (10 g/L)
Chloride ion (50 ppm)
ViaForm® Extreme Accelerator (6 mL/L)
ViaForm® Extreme Suppressor (2 mL/L)
The electrolytic copper deposition chemistry was prepared according to the instructions provided by ViaForm® manufacturer Enthone Inc. (West Haven, Conn.). No leveler was added to the composition.

Example 4

Comparative Electrolytic Copper Deposition Chemistry

An electrolytic copper deposition chemistry of the invention was prepared having the following components and concentrations:
Copper ion from copper sulfate (40 g/L $Cu^{2+}$)
Sulfuric Acid (10 g/L)
Chloride ion (50 ppm)
ViaForm® Extreme Accelerator (6 mL/L)
ViaForm® Extreme Suppressor (2 mL/L)
ViaForm® Extreme Leveler (3 mL/L)
The electrolytic copper deposition g composition was prepared according to the instructions provided by ViaForm® manufacturer Enthone Inc. (West Haven, Conn.).

Example 5

Impurity Inclusion Analysis

The compositions of Examples 1 through 4 were used to deposit copper on a wafer substrate. In each deposition, the plating conditions were as follows: Temperature 25° C., Current Density 10 mA/cm² for 30 seconds with agitation, followed by deposition at Current Density 60 mA/cm², with agitation for 30 additional seconds. The total thickness of the deposit was about one micrometer.

The copper layers were analyzed to determine the concentration in ppm of sulfur, oxygen, chloride, and carbon by SIMS elemental analysis. The following Table I was prepared from the results:

TABLE I

| | Elemental Analysis in ppm | | | |
|---|---|---|---|---|
| Composition | Sulfur | Oxygen | Chloride | Carbon |
| Example 1 | 0.40 | 17.3 | 0.7 | 10.0 |
| Example 2 | 0.38 | 18.2 | 0.5 | 10.1 |
| Example 3 | 0.33 | 8.0 | 6.2 | 16.3 |
| Example 4 | 24.7 | 572.2 | 109.0 | 239.0 |

It is apparent from Table I that the addition of a conventional commercially available leveler to the electrolytic copper plating chemistry of Example 4 resulted in the deposition of a copper layer having a much higher impurity content for each element measured than the copper layers deposited from the electrolytic copper plating chemistry without the presence of leveler of Examples 3.

The electrolytic copper plating chemistry of Example 1 and 2, in which the invention leveler was added, deposited copper layers that have impurity concentrations greatly less than the copper layers deposited from conventional leveler of Example 4. Moreover, the film purity of Example 1 and 2 with the invention levelers is comparable to the film purity of Example 3 that excludes a leveler. Particularly, the Example 1 and 2 have the lowest amount of chloride, one order magnitude lower than that of copper plating chemistry as Example 3 that excludes a leveler.

Example 6

Figure 2:
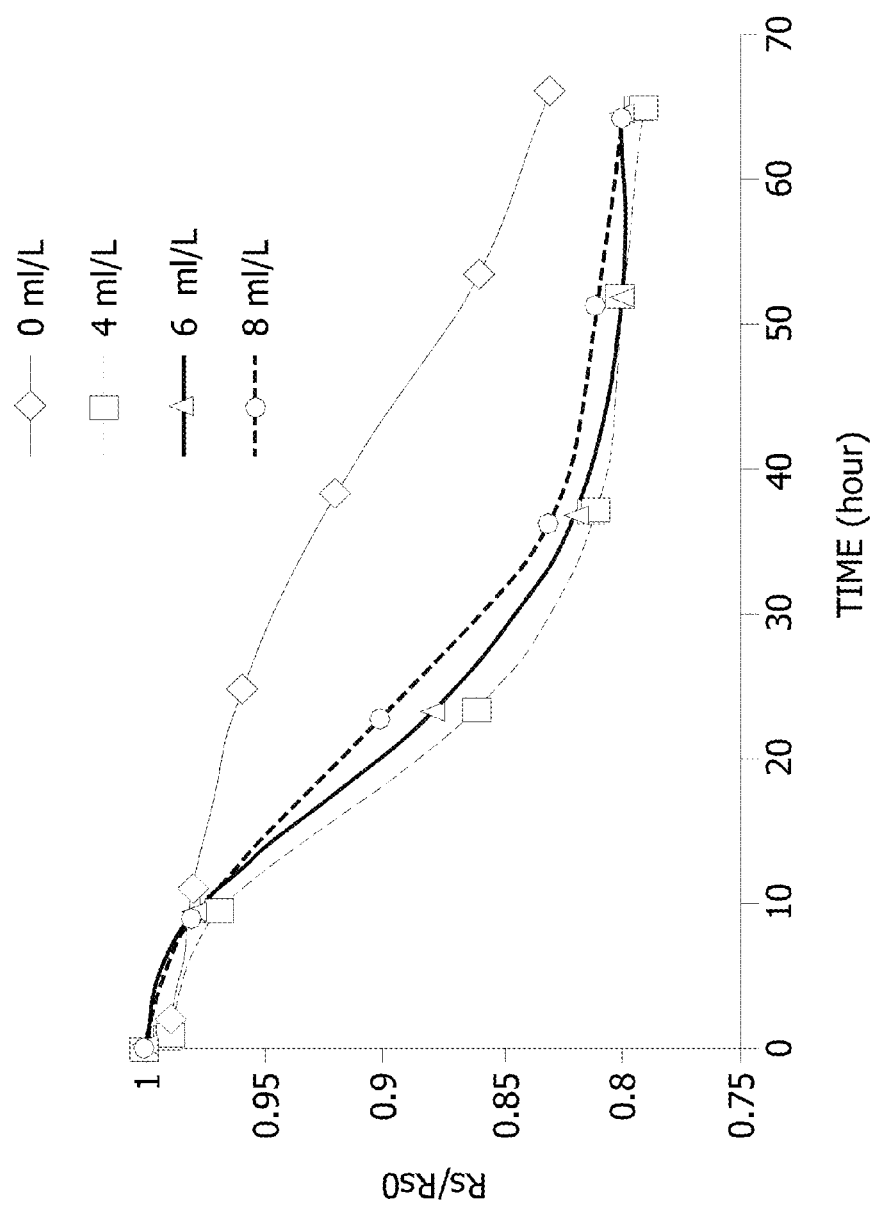
FIG. 2 is a graph of changes in resistance during a room temperature anneal. The data used to construct the graph were collected based on the method of Example 6.

Post-Deposition Anneal of Copper Deposited from Electrolytic Copper Deposition Chemistries of the Invention Copper layers deposited from the electrolytic copper deposition chemistries of Examples 1 and 2 using various leveler concentrations were subjected to post-deposition room temperature anneal. The results are shown in FIG. 1 and FIG. 2. The graph in FIGS. 1 and 2 was constructed by measuring the initial resistance of the fresh copper deposits (Rs0) and measuring the change in resistance (Rs) over the course of about 3 days.

To construct FIG. 1, four copper layers were deposited from the electrolytic copper deposition chemistry of Example 1 (Leveler of Structure (VIII) having 13 to 14 repeat units), in which the leveler concentrations were 0 mL/L, 0.5 mL/L, 1 mL/L, 1.5 mL/L, and 2 mL/L. The initial resistance (Rs0) was measured for each, and the resistance (Rs) was measured over the course of about 70 hour anneal at room temperature. The Y-axis data resulted from dividing the Rs measurement at each time by the initial resistance (Rs0). FIG. 1 therefore shows the decrease in resistance over the course of 70 hour room temperature anneal. Inclusion of the levelers of the present invention therefore resulted in the deposition of a copper layer in which the resistance decreased in a faster speed than the copper layer in which no leveler was added, due to less inclusion in chloride content.

To construct FIG. 2, four copper layers were deposited from the electrolytic copper deposition chemistry of Example 2 (Leveler of Structure (VIII) having 5 to 6 repeat units), in which the leveler concentrations were 0 mL/L, 4 mL/L, 6 mL/L and 8 mL/L. The initial resistance (Rs0) was measured for each, and the resistance (Rs) was measured over the course of an about 70 hour anneal at room temperature. The Y-axis data resulted from dividing the Rs measurement at each time by the initial resistance (Rs0). FIG. 2 also shows the decrease in resistance over the course of a 70 hour room temperature anneal. Inclusion of the levelers of the present invention therefore resulted in the deposition of a copper layer in which the resistance decreased in a faster speed than the copper layer in which no leveler was added.

Example 7

Figure 3:
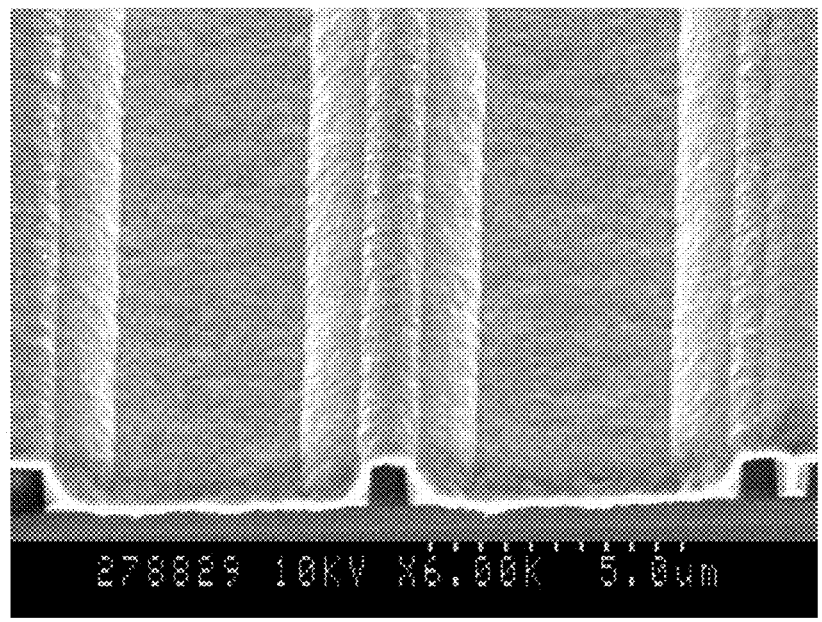
FIG. 3 is a cross-section image of electroplated test trench that exhibits underplate. The test trench was filled according to the method of Example 7.
Figure 4:
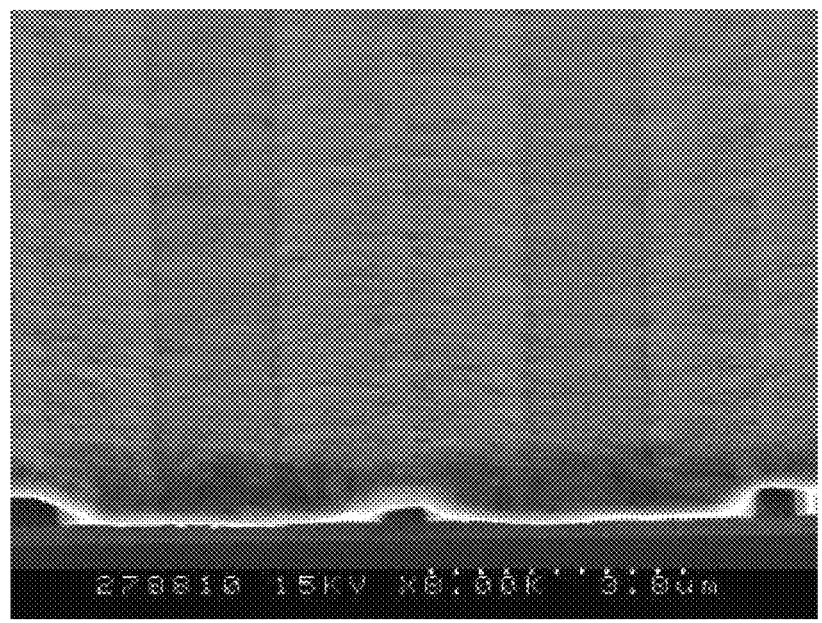
FIG. 4 is a cross-section image of electroplated test trench that has less underplate. The test trench was filled according to the method of Example 7.
Figure 5:
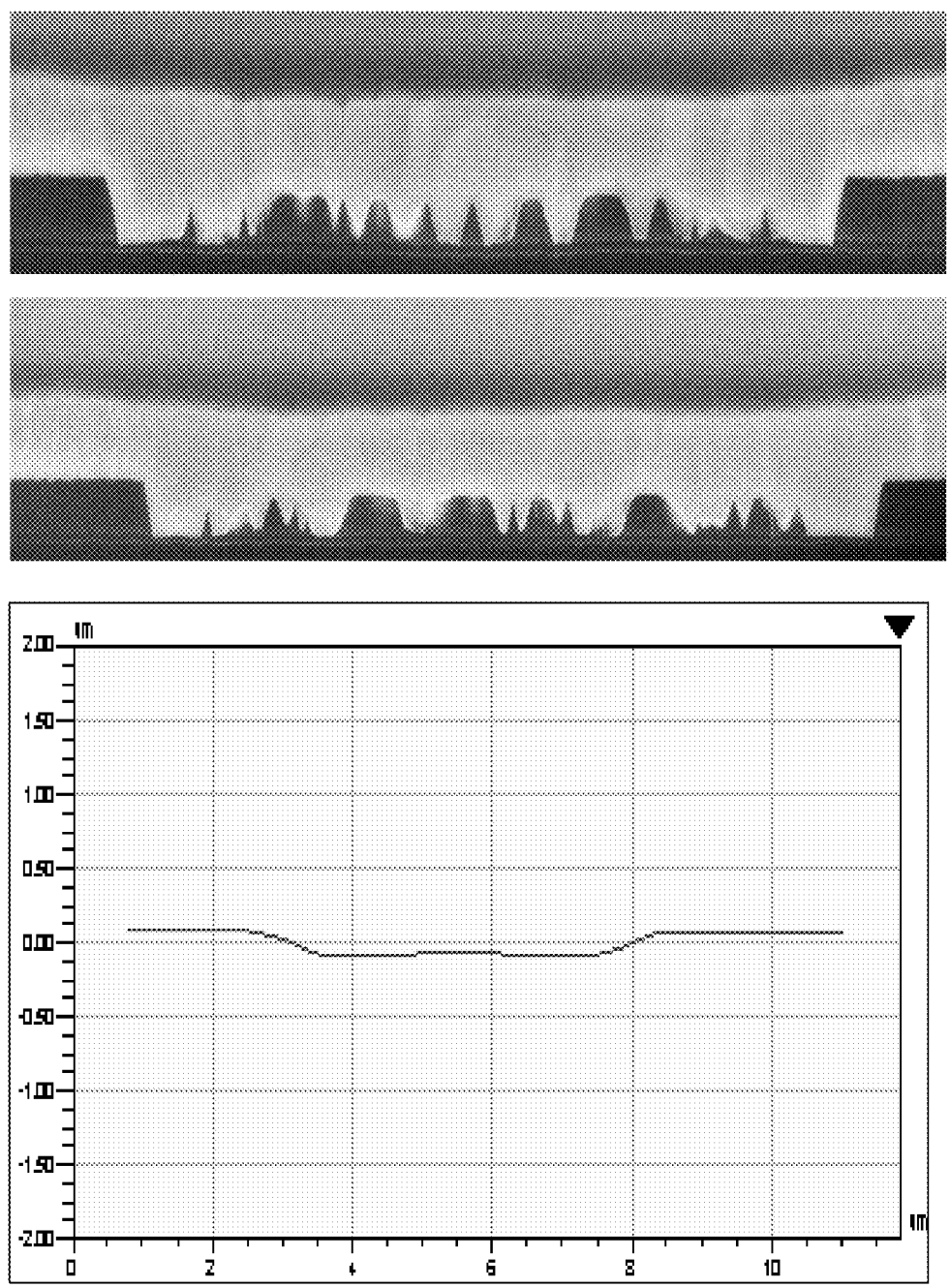
FIG. 5 is a cross-section image of partially filled test trench. The test trench was filled according to the method of Example 7.
Figure 6:
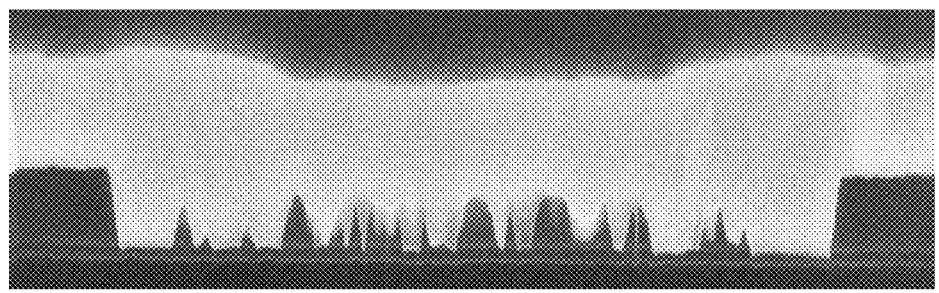
FIG. 6 is a cross-section image of a filled test trench. The test trench was filled according to the method of Example 7.
Figure 6:
Figure 6:
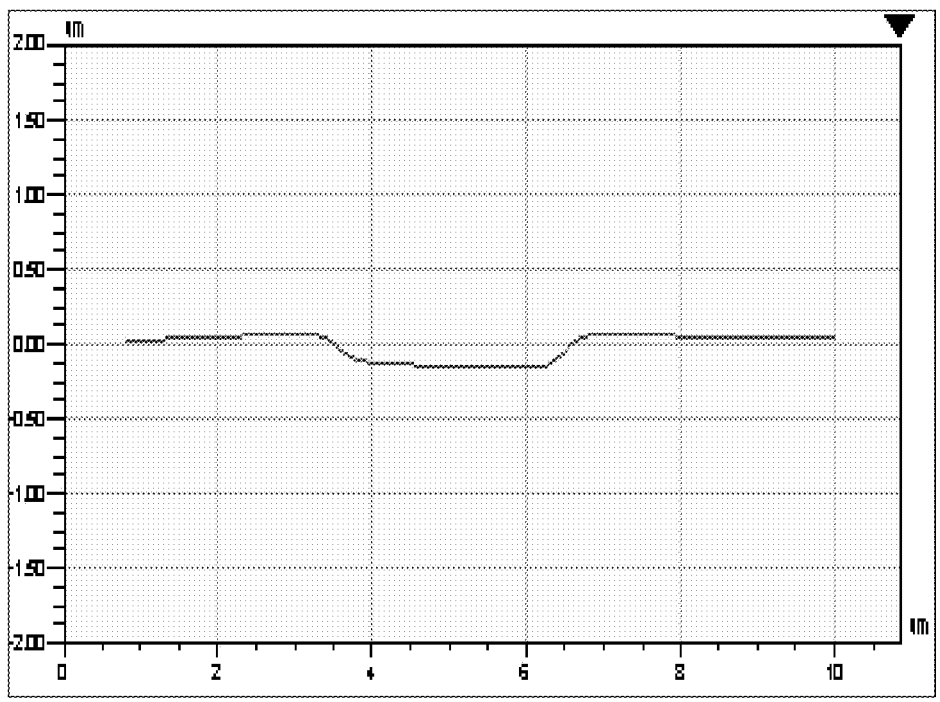

Large Feature Metallization Using Electrolytic Copper Deposition Chemistry of the Invention Substrates comprising large features were metallized using an electrolytic copper deposition chemistry having no leveler and an electrolytic copper deposition of Example 2 (Leveler of Structure (VIII) having 5 to 6 repeat units). The features had 1 micrometer depths and 5 micrometer openings (aspect ratio 1:5). SEM images of FIG. 3 were obtained of the copper deposited from the electrolytic copper deposition chemistry having no leveler of Example 3. SEM images of FIG. 4 and FIG. 6 were obtained of the copper deposited from the electrolytic copper deposition chemistry of Example 2 (Leveler of Structure (VIII) having 5 to 6 repeat units). SEM image of FIG. 5 was obtained of the copper deposited from the electrolytic copper deposition chemistry of Example 4 with conventional leveler. It is apparent from these figures that the copper deposited in the low aspect ratio features from the electrolytic copper deposition chemistry of Example 2 exhibited significantly less underplate than the copper deposited from the electrolytic copper deposition chemistry having no leveler and the electrolytic copper deposition chemistry with conventional leveler.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and methods without departing from the scope of the invention, it is intended that all matter contained in the above description and shown in the accompanying drawings shall be interpreted as illustrative and not in a limiting sense.

What is claimed is:

1. An electrolytic deposition composition comprising:
   (a) a source of copper ions;
   (b) a suppressor, wherein the suppressor comprises at least one amine functional group;
   (c) an accelerator, wherein the accelerator is an organic sulfur compound; and
   (d) a leveler compound, wherein the leveler compound comprises a polymer comprising the following general structure (IV):

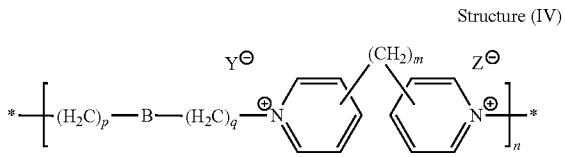

Structure (IV)

wherein B is selected from among:
a single bond, an oxygen atom (—O—), a methenyl hydroxide

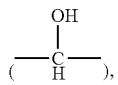

a carbonyl

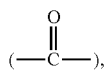

an amino

an imino

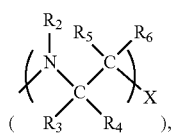

a sulfur atom (—S—), a sulfoxide

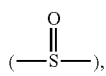

a phenylene

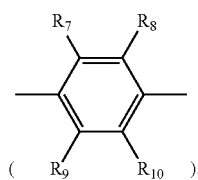

and a glycol

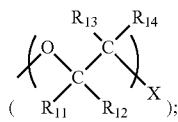

and
p and q may be the same or different, are integers between 0 and 6, wherein at least one of p and q is at least 1;
X is an integer from one to about four;
Y and Z are leaving groups selected from among chloride, bromide, iodide, tosyl, triflate, sulfonate, mesylate, methosulfate, fluorosulfonate, methyl tosylate, brosylate, or nosylate; m is an integer between zero and six; and n is an integer that is at least 2; and
$R_1$ through $R_{14}$ are each independently hydrogen, substituted or unsubstituted alkyl having from one to six carbon atoms, substituted or unsubstituted alkylene having from one to six carbon atoms, or substituted or unsubstituted aryl.

2. A composition as set forth in claim 1 wherein the leveler compound comprises a polymer having the following general structure (V):

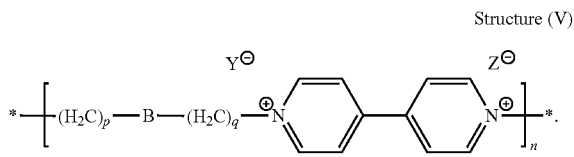

Structure (V)

3. A composition as set forth in claim 1 wherein the leveler compound is selected from the group consisting of:
(i) a polymer comprising the following structure (VI):

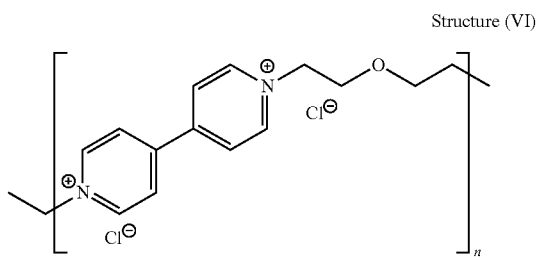

Structure (VI)

wherein n is an integer of at least 2;
(ii) a polymer comprising the following structure (IX):

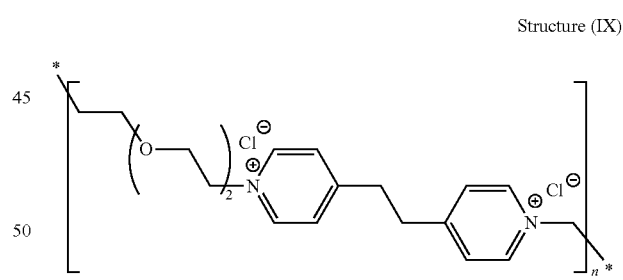

Structure (IX)

wherein n is an integer of at least 2;
(iii) a polymer comprising the following structure (X):

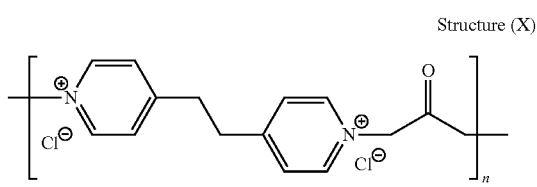

Structure (X)

wherein n is an integer of at least 2;

(iv) a polymer comprising the following structure (XI):

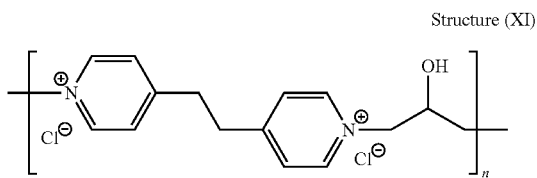

Structure (XI)

wherein n is an integer of at least 2; and (v) a polymer comprising the following structure (XII):

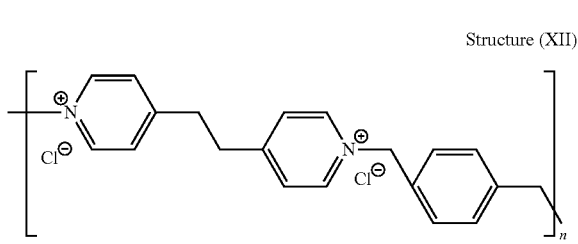

Structure (XII)

wherein n is an integer of at least 2.

4. A composition as set forth in claim 1 wherein the leveler compound comprises a polymer comprising the following general structure (VII):

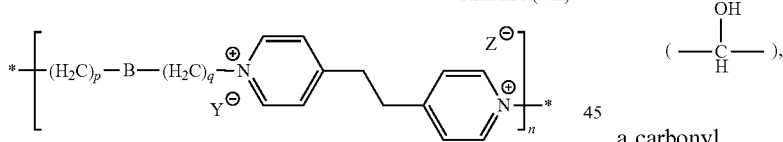

Structure (VII)

wherein n is an integer of at least 2.

5. A composition as set forth in claim 1 wherein the leveler compound comprises a polymer comprising the following structure (VIII):

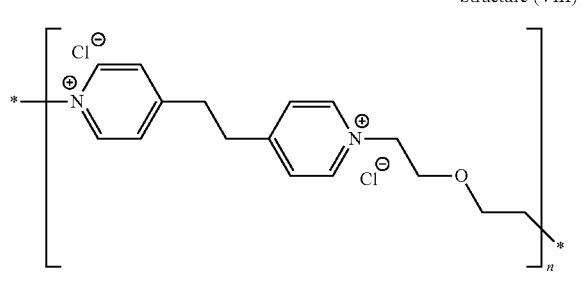

Structure (VIII)

wherein n is an integer of at least 2.

6. The electrolytic deposition composition according to claim 1, wherein the accelerator is a water soluble organic divalent sulfur compound.

7. The electrolytic deposition composition according to claim 6, wherein the accelerator is in the composition at a concentration between about 1 ppm and about 50 ppm.

8. The electrolytic deposition composition according to claim 6, wherein the organic sulfur compound is 3,3-dithiobis(1-propanesulfonic acid).

9. The electrolytic deposition composition according to claim 1, wherein the suppressor is an EO/PO block copolymer with a molecular weight between about 1000 g/mol and about 30,000 g/mol.

10. The electrolytic deposition composition according to claim 9, wherein the suppressor is in the composition at a concentration between about 10 and about 1000 ppm.

11. An electrolytic deposition composition comprising:
(a) a source of copper ions;
(b) a suppressor, wherein the suppressor comprises at least one amine functional group;
(c) an accelerator, wherein the accelerator is an organic sulfur compound; and
(d) a leveler compound, the leveler compound comprises the following general structure (XIII):

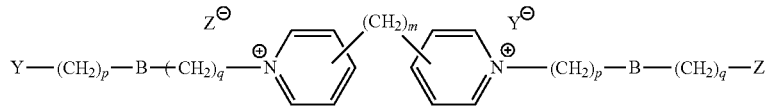

Structure (XIII)

wherein B is selected from among:
a single bond, an oxygen atom (—O—), a methenyl hydroxide

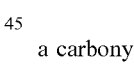

a carbonyl

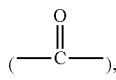

an amino

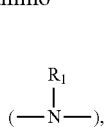

an imino

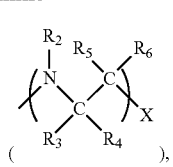

a sulfur atom (—S—), a sulfoxide

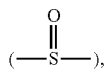, a phenylene

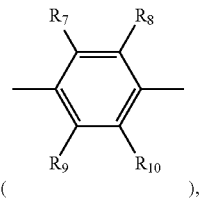, and a glycol

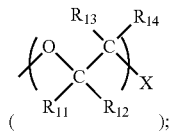;

and p and q may be the same or different, are integers between 0 and 6, wherein at least one of p and q is at least 1;

X is an integer from one to about four;

Y and Z are leaving groups selected from among chloride, bromide, iodide, tosyl, triflate, sulfonate, mesylate, methosulfate, fluorosulfonate, methyl tosylate, brosylate, or nosylate; and m is an integer between zero and six; and $R_1$ through $R_{14}$ are each independently hydrogen, substituted or unsubstituted alkyl having from one to six carbon atoms, substituted or unsubstituted alkylene having from one to six carbon atoms, or substituted or unsubstituted aryl.

12. A composition as set forth in claim 11 wherein the leveler compound comprises the following general structure (XVI):

Structure (XVI)

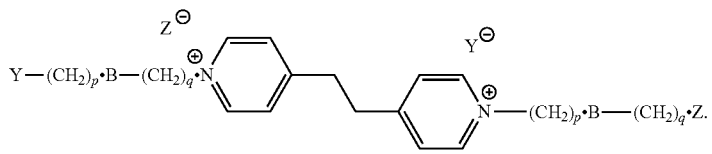

13. A composition as set forth in claim 11 wherein the leveler compound comprises the following structure (XVII):

Structure (XVII)

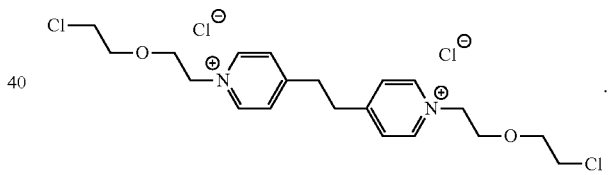

14. A composition as set forth in claim 11 wherein the leveler compound comprises the following structure (XVIII):

Structure (XVIII)

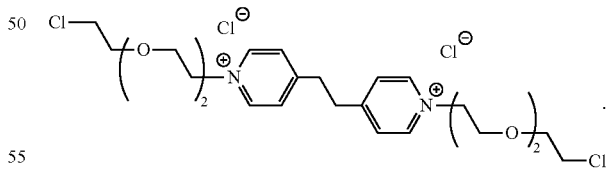

15. A composition as set forth in claim 11 wherein the leveler compound comprises the following general structure (XIV):

Structure (XIV)

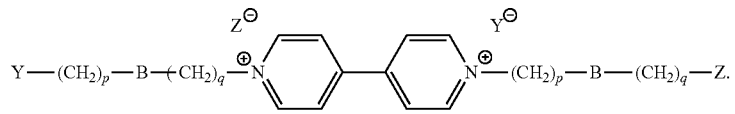

16. A composition as set forth in claim 11 wherein the leveler compound comprises the following general structure (XV):
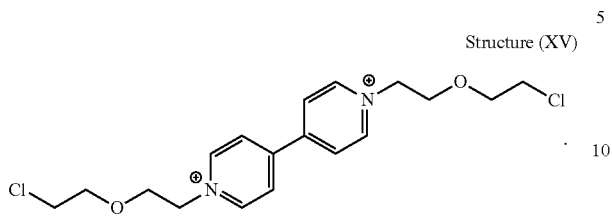
Structure (XV)
* * * * *